United States Patent
Jain

(10) Patent No.: US 11,568,925 B2
(45) Date of Patent: Jan. 31, 2023

(54) MEMORY DEVICE

(71) Applicant: TAIWAN SEMICONDUCTOR MANUFACTURING CO., LTD., Hsinchu (TW)

(72) Inventor: Sanjeev Kumar Jain, Ottawa (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 13 days.

(21) Appl. No.: 17/084,880

(22) Filed: Oct. 30, 2020

(65) Prior Publication Data

US 2022/0139451 A1   May 5, 2022

(51) Int. Cl.
*G11C 11/418* (2006.01)
*G11C 11/419* (2006.01)
*G11C 11/412* (2006.01)

(52) U.S. Cl.
CPC .......... *G11C 11/419* (2013.01); *G11C 11/418* (2013.01); *G11C 11/412* (2013.01); *G11C 2207/007* (2013.01)

(58) Field of Classification Search
CPC .... G11C 11/419; G11C 11/418; G11C 11/412
USPC .................................................. 365/189.15
See application file for complete search history.

(56) References Cited

U.S. PATENT DOCUMENTS

| | | | |
|---|---|---|---|
| 6,370,078 B1* | 4/2002 | Wik .................... | G11C 8/16 |
| | | | 365/69 |
| 9,455,024 B1* | 9/2016 | Dozaka ............... | G11C 5/025 |
| 9,697,890 B1* | 7/2017 | Wang .................. | G11C 7/12 |
| 2006/0215465 A1* | 9/2006 | Bhavnagarwala .... | G11C 11/412 |
| | | | 365/189.12 |
| 2008/0117666 A1* | 5/2008 | Russell ............... | G11C 8/16 |
| | | | 365/154 |
| 2008/0123462 A1* | 5/2008 | Liaw .................. | G11C 8/16 |
| | | | 365/230.05 |
| 2021/0034567 A1* | 2/2021 | Bringivijayaraghavan .................. | G06F 3/0659 |
| 2021/0043245 A1* | 2/2021 | Ji ....................... | G11C 11/4091 |

FOREIGN PATENT DOCUMENTS

JP    2003132684 A  *  5/2003   ............... G11C 8/16

\* cited by examiner

*Primary Examiner* — Ly D Pham
(74) *Attorney, Agent, or Firm* — Birch, Stewart, Kolasch & Birch, LLP

(57) ABSTRACT

A memory device is disclosed. The memory device includes a memory array including a first memory cell arranged in a first row and a first column and a second memory cell arranged in the first row and a second column next to the first column. The first memory cell is configured to perform a write operation in response to a first write signal transmitted through a first write word line. The second memory cell is configured to perform the write operation in response to a second write signal transmitted through a second write word line. The second write word line is separated from and next to the first write word line. The first write signal and the second write signal have different logic values.

20 Claims, 19 Drawing Sheets

|  |  |
|---|---|
| 100 | 400 |
| 300 | 200 |

MEMORY DEVICE

BACKGROUND

Static random access memories (SRAMs) are generally used in applications requiring high speed, such as microprocessors and other data processing systems which use register files and memories for high speed computing. Each SRAM cell stores one bit of data and is implemented as a pair of cross-coupled inverters which are stable in one of two possible voltage levels, and the logic state of the cell is determined with a pair of access transistors, thereby creating the basic six-transistor (6T) SRAM architecture. The read stability and writability of SRAM cells have been improved by adding additional transistors to the basic 6T architecture. For example, 8T and 10T subthreshold SRAMs have been proposed which provide single-ended read sensing, but such structures still suffer from write disturbs resulting from shared word lines and a low read operation speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a schematic diagram of a memory device including the memory cell corresponding to FIG. 1, in accordance with other embodiments of the present disclosure.

DETAILED DESCRIPTION

Figure 1:
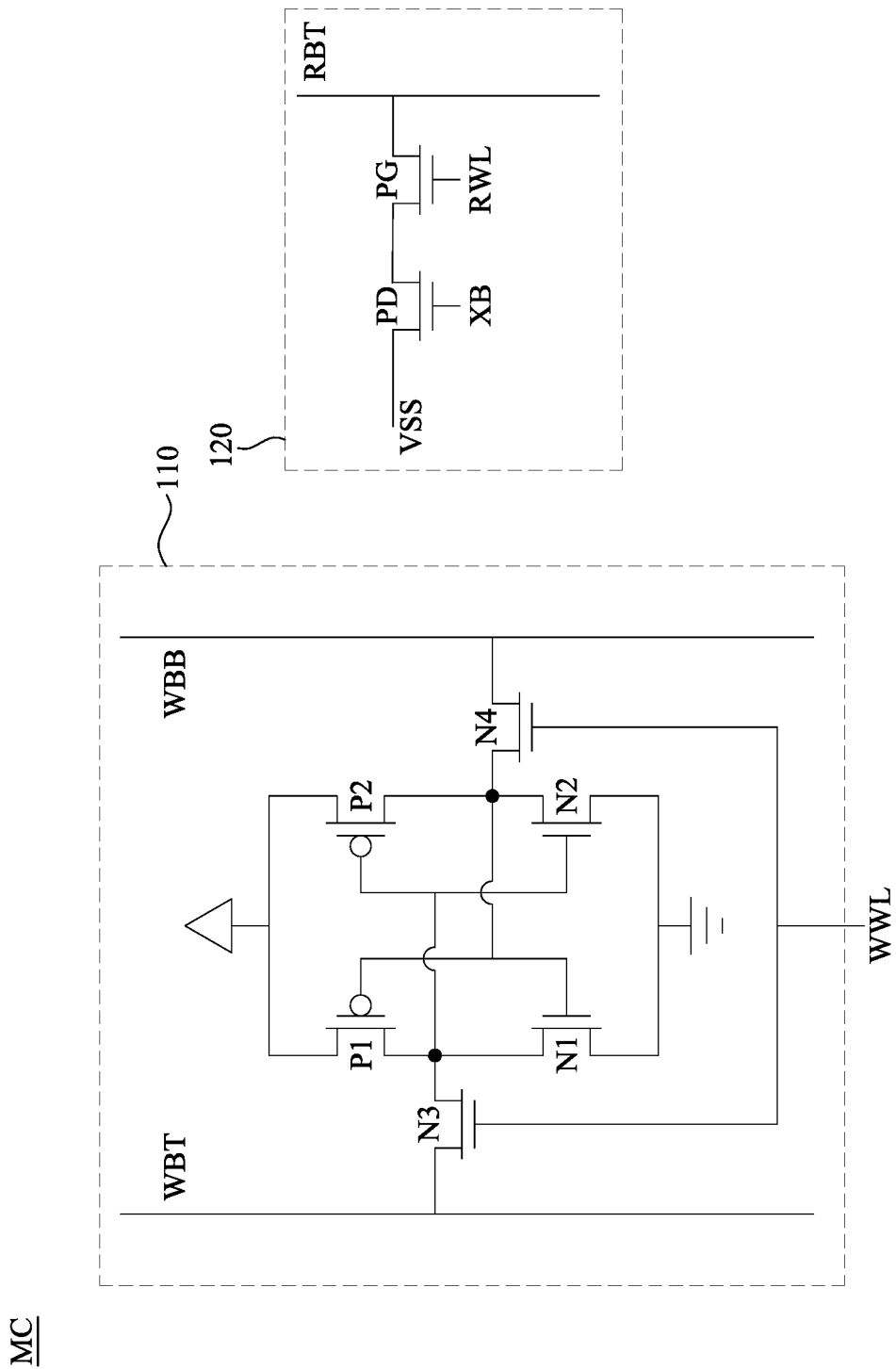
FIG. 1 is a schematic diagram of a memory cell in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a memory cell MC in accordance with various embodiments of the present disclosure. In some embodiments, the memory cell MC is referred to as a two-port cell. As shown in FIG. 1, the memory cell MC includes a write port circuit 110 and a read port circuit 120. The write port circuit 110 is coupled to a complimentary pair of write data lines WBT and WBB. In some embodiments, the write data lines WBT and WBB transmit signals with bit data, and are referred to as write bit lines. The read port circuit 120 is coupled to a read data line RBT which is referred to as a read bit line. In some embodiments, the memory cell MC is implemented as a 8T static random access memory (SRAM.)

The write port circuit 110 includes p-type transistors P1-P4 and n-type transistors N1-N4. The write port circuit 110 includes a first inverter formed by the transistors P1 and N1 and a second inverter formed by the transistors P2 and N2. The first and second inverters are cross-coupled as a data storage.

For illustration, the drains of the transistors P1 and N1 are electrically connected together, forming a storage node XT. The gates of the transistors P1 and N1 are electrically connected together. The source of the transistor P1 is electrically connected to a supply voltage (i.e., a power line) VDD. The source of the transistor N1 is electrically connected to a complimentary power line VSS (i.e., a supply voltage, or a ground.)

The drains of the transistors P2 and N2 are electrically connected together, forming a storage node XB (also referred to as a storage node bar XB). The gates of the transistors P2 and N2 are electrically connected together. The source of the transistor P2 is electrically connected to the supply voltage VDD. The source of the transistor N2 is electrically connected to the support voltage VSS.

Furthermore, the storage node XT is electrically connected to the gates of the transistor P2 and N1, and the storage node XB is electrically connected to the gates of the transistors P1 and N1. Therefore, the first and second inverters are cross-coupled as illustrated in FIG. 1.

In some embodiments, the write port circuit 110 further includes a pass-gate device formed with an n-type transistor N3 and another pass-gate device formed with an n-type transistor N4. The source of the transistor N1 is electrically connected to the storage node XT, and the source of the transistor N4 is electrically connected to the storage node XB, forming a write port for data access. Furthermore, the drain of the transistor N3 is electrically connected to the write bit line WBT, and the gate of the transistor N3 is electrically connected to a write word line WWL. Similarly, the drain of the transistor N4 is electrically connected to the write bit line WBS, and the gate of the transistor N4 is electrically connected to the write word line WWL.

For illustration, the read port circuit 120 of the two-port cell MC includes n-type transistors PD and PG. The transistor PD is also referred to as a read pull-down transistor (RPD) and the transistor PG is also referred to as a read pass-gate transistor (RPG.) The transistors PD and PG are serially coupled between the support voltage VSS and the read bit line RBT. In the example of FIG. 1, the transistor PD has a source coupled to the supply voltage VSS, and a drain coupled to a drain of the transistor PG. The gate of the transistor PD is coupled to the storage node XB. The source of the transistor PG is coupled to the read bit line RBT, and the gate of the transistor PG is controlled by a read word line RWL.

In some embodiments, in a write operation, the voltage on the write word line WWL is raised above a predetermined level to turn on the transistors N3 and N4. During the write operation, the voltage of the read word line RWL is below a predetermined level, and the transistor PG is turned off. In some examples, the write bit line WBT is pulled high, and the complementary write bit line WBB is pulled low, or vice versa, in order to write logic "1" or "0" to the memory cell MC.

In some embodiments, in a read operation, the voltage on the read word line RWL is raised to a predetermined level to turn on the transistor PG. During the read operation, the voltage on the write word line WWL is below a predetermined level and the transistors N3-N4 are turned off. The sensing current on the read bit line RBT is then detected by a sense amplifier to determine the logic state of the memory cell MC.

The configurations of FIG. 1 are given for illustrative purposes. Various implements are within the contemplated scope of the present disclosure. For example, in some embodiments, the memory cell MC includes additional devices such as additional pull-down devices and pass-gate devices. In various embodiments, each of the first and second inverters includes one or more pull-down devices configured in parallel.

Figure 2:
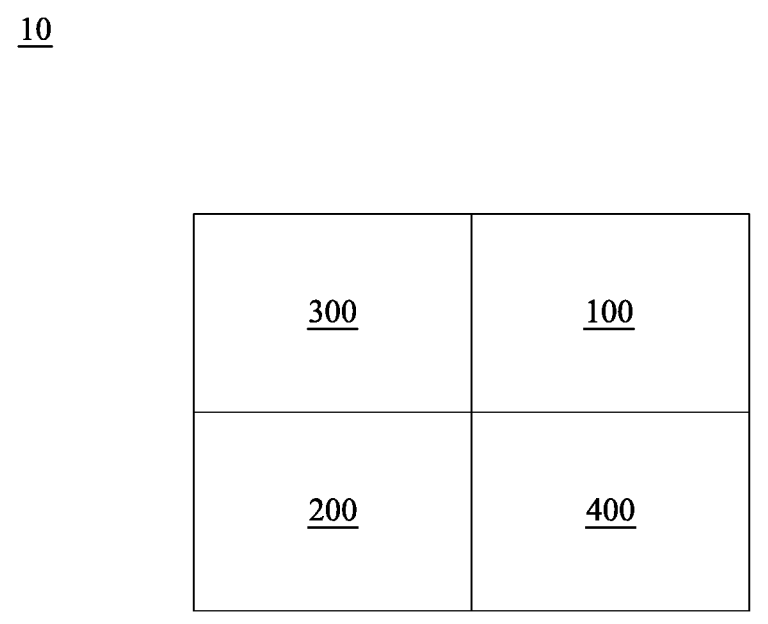

Reference is now made to FIG. 2. FIG. 2 is a schematic diagram of a memory device 10 including the memory cell MC corresponding to FIG. 1, in accordance with other embodiments of the present disclosure. For illustration, the memory device 10 includes a memory array 100, a control unit 200, a post decoder circuit 300, and an input/output unit 400. In some embodiments, the memory array 100 includes memory cells configured with respect to, for example, the memory cell MC of FIG. 1. The control unit 200 is configured to generate multiple signals decoded by the post decoder circuit 300 for operating/controlling the memory array 100 and the input/output unit 400. The detail operation will be discussed in the following paragraphs.

Figure 3:
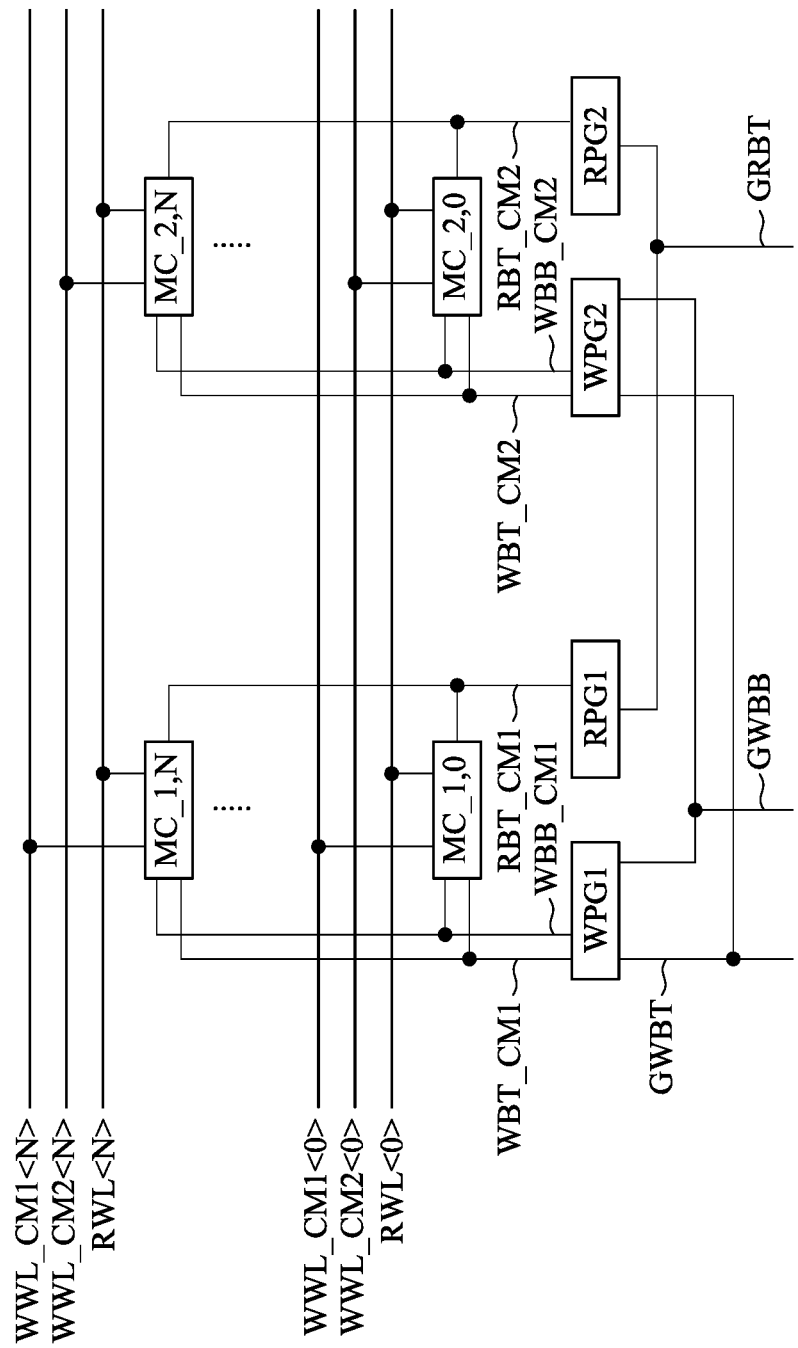
FIG. 3 is a schematic diagram of part of the memory device in FIG. 2, in accordance with other embodiments of the present disclosure.

Reference is now made to FIG. 3. FIG. 3 is a schematic diagram of part of the memory device 10 in FIG. 2, in accordance with other embodiments of the present disclosure. For illustration, the memory array 100 includes memory cells MC_1,0-MC_1,N arranged in a first column and memory cells MC_2,0-MC_2,N arranged in a second column next to the first column. In some embodiments, each of the memory cells MC_1,0-MC_1,N and a corresponding one of the memory cells MC_2,0-MC_2,N are arranged in the same row and next to each other. For example, as shown in FIG. 3, the memory cells MC_1,0 and MC_2,0 are arranged in the same row, and the memory cells MC_1,N and MC_2,N are arranged in the same row. In some embodiments, the memory cells MC_1,0-MC_1,N and MC_2,0-MC_2,N are configured with respect to, for example, the memory cell MC in FIG. 1.

For illustration, each of the memory cells MC_1,0-MC_1,N in the first column is coupled to a write pass gate circuit WPG1 through a write bit line WBT_CM1 and a write bit line WBB_CM1, and is coupled to a read pass gate circuit RPG1 through a read bit line RBT_CM1. Similarly, each of the memory cells MC_2,0-MC_2,N in the second column is coupled to a write pass gate circuit WPG2 through a write bit line WBT_CM2 and a write bit line WBB_CM2, and is coupled to a read pass gate circuit RPG2 through a read bit line RBT_CM2. In some embodiments, the write bit lines WBT_CM1 and WBT_CM2 are configured with respect to, for example, the write bit line WBT. The write bit lines WBB_CM1 and WBB_CM2 are configured with respect to, for example, the write bit line WBB. The read bit line RBT_CM1 and RBT_CM2 are configured with respect to, for example, the read bit line RBT. In some embodiments, there are 64 memory cells in the first column, and the number N equals to 63. The number of the included memory cells in the memory array 100 is given for the illustrative purposed. Various implements are within the contemplated scope of the present disclosure. For example, in some embodiments, there are more than 64 memory cells, for example, 128 memory cells in the first column, and the number N equals to 127.

In addition, as shown in FIG. 3, the write pass gate circuits WPG1-WPG2 are further coupled with each other through a global write bit line GWBT and a complementary global write bit line GWBB (also referred to as write bit line bar GWBB.) The read pass gate circuits RPG1-RPG2 are further coupled with each other through a global read bit line GRBT.

For illustration, each of the memory cells MC_1,0-MC_1,N in the first column is coupled to one of write word lines WWL_CM1<0>-WWL_CM1<N>. For example, the memory cell MC_1,0 is coupled to the write word line WWL_CM<0>, and the memory cell MC_1,N is coupled to the write word line WWL_CM<N>. Similarly, each of the memory cells MC_2,0-MC_2,N in the second column is coupled to one of write word lines WWL_CM2<0>-WWL_CM2<N>. The write word lines WWL_CM1<0>-WWL_CM1<N> and WWL_CM2<0>-WWL_CM2<N> are electrically isolated from each other. Accordingly, in some embodiments, when a write operation is performed to a selected memory cells in the memory array 100, for example the memory cell MC_1,N being selected, the write word line WWL_CM1<N> is activated (i.e., a voltage level of the write word line WWL_CM1<N> is raised) to turn on the memory cell MC_1,N. In the meanwhile, the write bit lines WBT_CM1 and WBB_CM1 are precharged/discharged by the write pass gate circuit WPG1 to write a data transmitted from the global write bit lines GWBT and GWBB into the memory cell MC_1,N.

As mentioned above, memory cells in the same row and in different columns are coupled to different write word lines. In some embodiments, write signals for different write word lines are generated according to a column address. Accordingly, the write pass gate devices of memory cells are turned on by columns in response to the write signals. The details of the write signals are discussed later.

In some approaches, two 8-transistor memory cells arranged in the same row and adjacent columns are coupled to the same write word line, and one of the memory cells is selected by a column multiplexer to access write bit lines coupled to the selected memory cell. However, when the write word line is activated for a write operation, write pass gate devices of both of the selected memory cell and unselected memory cells are turned on. Accordingly, for the unselected memory cell, charges in the bit lines disturb charges stored in storage nodes, and if the inverters are not strong enough (i.e., the static noise margin (SNM) is too small), the stored data is disturbed. Alternatively stated, a write disturb happens to the storage nodes coupled to the write pass gate devices in the unselected memory cell.

In contrast, with the configurations of the present disclosure, the write word lines for the selected memory cell and the unselected memory cell are separated and isolated. The write pass gate devices of the unselected memory cell remain turned off in accordance with an inactivated write word line when the selected memory cell is turned on by an activated write word line. Consequently, the stability of the data stored in the unselected memory cell increases.

In addition, as shown in FIG. 3, the memory cells in the same row and different columns are coupled to the same read word line. For example, the memory cells MC_1,N and MC_2,N are coupled to a read word line RWL_<N>. In some embodiments, the read word lines RWL_<0>-RWL_<N> are configured with respect to, for example, the read word line RWL of FIG. 1.

The configurations of FIG. 3 are given for illustrative purposes. Various implements are within the contemplated scope of the present disclosure. For example, in some embodiments, the memory cells in the same row are coupled to different read word lines.

Figure 4:
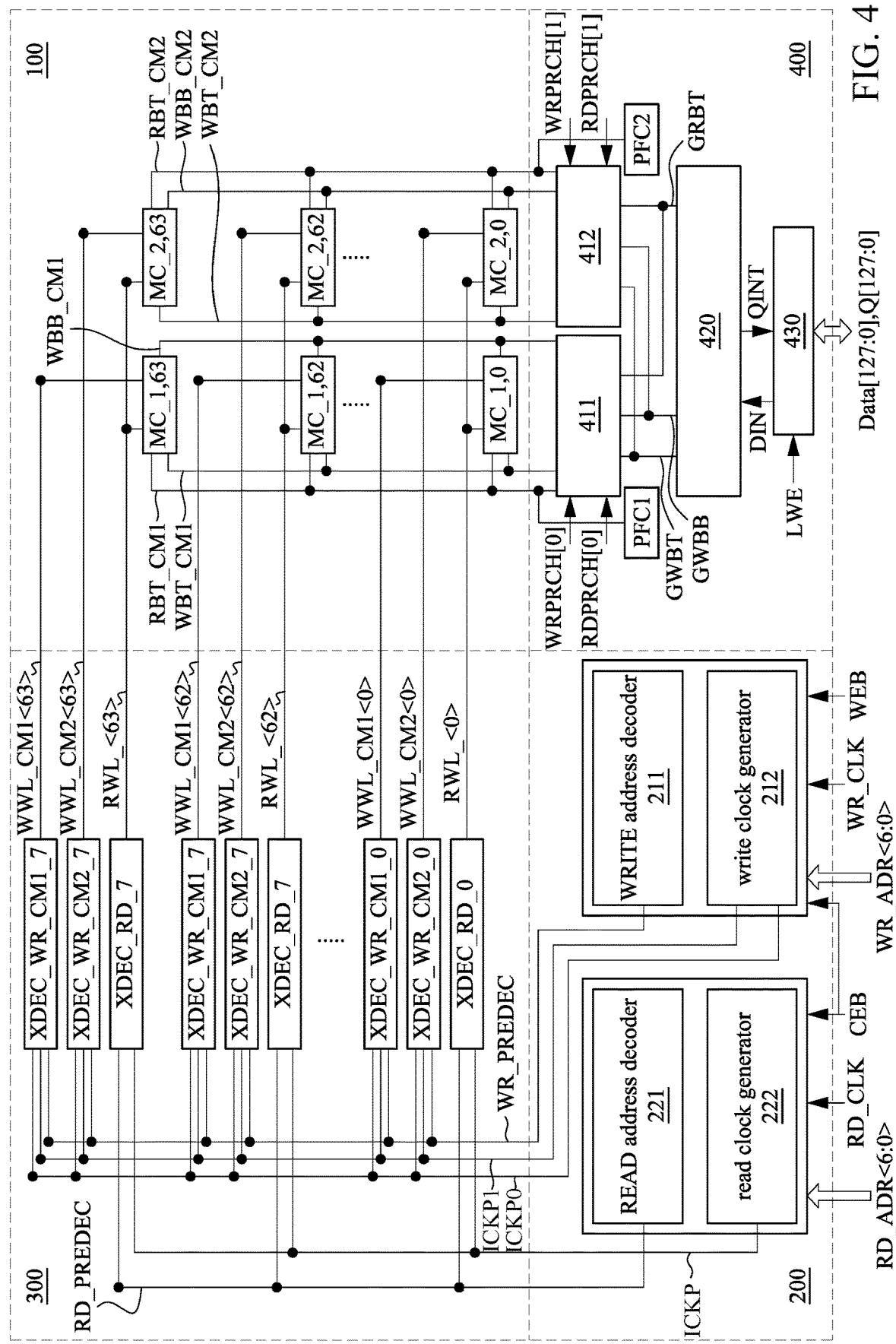
FIG. 4 is a schematic detailed diagram of the memory device in FIG. 2, in accordance with other embodiments of the present disclosure.

Reference is now made to FIG. 4. FIG. 4 is a schematic detailed diagram of the memory device 10 in FIG. 2, in accordance with other embodiments of the present disclosure. With respect to the embodiments of FIGS. 1-3, like elements in FIG. 4 are designated with the same reference numbers for ease of understanding. The specific operations of similar elements, which are already discussed in detail in above paragraphs, are omitted herein for the sake of brevity.

In the embodiments of FIG. 4, the memory array 100 includes 64 memory cells MC_1,0-MC_1,63 in the first column and 64 memory cells MC_2,0-MC_2,63 in the second column. As shown in FIG. 4, every two memory cells arranged in the same row are coupled to the same read word line and coupled to different write word lines. For example, the memory cells MC_1,0 and MC_2,0 are coupled to the read word line RWL_<0>, and are coupled to the write word lines WWL_CM1<0> and WWL_CM2<0> respectively. The configurations of the memory cells MC_1,1-MC_1,63 and MC_2,1-MC_2,63 are similar to that of the memory cells MC_1,0 and MC_2,0. Hence, the repetitious descriptions are omitted here.

For illustration, the write word lines WWL_CM1<0>-WWL_CM1<63> are coupled with post decoders XDEC_WR_CM1_0-XDEC_WR_CM1_7. The write word lines WWL_CM2<0>-WWL_CM2<63> are coupled with post decoders XDEC_WR_CM2_0-XDEC_WR_CM2_7. The read word lines read word line RWL_<0>-RWL_<63> are coupled with post decoders XDEC_RD_0-XDEC_RD_7. In some embodiments, the post decoders are configured to decode signals received from the control unit 200 and to output decoded signals as write signals to the coupled write word lines and read signals to the coupled read word lines. In some embodiments, the write signals transmitted in the write word lines WWL_CM1<0>-WWL_CM1<63> and WWL_CM2<0>-WWL_CM2<63> are referred to as the write signals WWL_CM1<0>-WWL_CM1<63> and WWL_CM2<0>-WWL_CM2<63> for the sake of simplicity. Similarly, the read signals transmitted in the read word lines RWL_<0>-RWL_<63> are referred to as the read signals RWL_<0>-RWL_<63> for the sake of simplicity.

As shown in FIG. 4, the control unit 200 includes a write control circuit 210 and a read control circuit 220. In some embodiments, the write control circuit 210 is configured to receive a write word address WR_ADR<6:0>, a write clock signal WR_CLK, a clock enable signal CEB and a write enable signal WEB to performing a write operation to the memory array 100. In some embodiments, the write control circuit 210 is enabled in response to the clock enable signal CEB and the write enable signal WEB. The read control circuit 220 is configured to receive a read word address RD_ADR<6:0>, a read clock signal RD_CLK, and the clock enable signal CEB to performing a read operation to the memory array 100. In some embodiments, the read control circuit 220 is enabled in response to the clock enable signal CEB.

For illustration, the write control circuit 210 includes a write address decoder 211 and a write clock generator 212. In some embodiments, the write address decoder 211 is configured to generate, based on the write word address WR_ADR<6:0> (i.e., a 7-bit data) and the write clock signal WR_CLK, a write select signal WR_PREDEC to the post decoders XDEC_WR_CM1_0-XDEC_WR_CM1_7 and XDEC_WR_CM2_0-XDEC_WR_CM2_7. The write clock generator 212 is configured to generate, based on the write word address WR_ADR<6:0> and the write clock signal WR_CLK, write clock signals ICKP0-ICKP1 to the post decoders XDEC_WR_CM1_0-XDEC_WR_CM1_7 and XDEC_WR_CM2_0-XDEC_WR_CM2_7.

Similarly, the read control circuit 220 includes a read address decoder 221 and a read clock generator 222. In some embodiments, the read address decoder 221 is configured to generate, based on the read word address RD_ADR<6:0> and the read clock signal RD_CLK, a read select signal RD_PREDEC to the post decoders XDEC_RD_0-XDEC_RD_7. The read clock generator 222 is configured to generate, based on the read word address RD_ADR<6:0> and the read clock signal RD_CLK, a read clock signal ICKP to the post decoders XDEC_RD_0-XDEC_RD_7.

In some embodiments, the memory array 100 is activated in response to signals received from the post decoder circuit 300 and transmits data to/from the input/output unit 400. For illustration, the input/output unit 400 includes pass gate circuits 411-412, feedback circuit PFC1-PFC2, a data access circuit 420, and a latch circuit 430. In some embodiments, the pass gate circuit 411 is coupled to the memory cells MC_1,0-MC_1,63 through coupling to the write bit lines WBT_CM1, WBB_CM1 and the read bit line RBT_CM1. The pass gate circuit 411 includes the write pass gate circuit WPG1 and the read pass gate circuit RPG1 in FIG. 3. Similarly, the pass gate circuit 412 is coupled to the memory cells MC_2,0-MC_2,63 through coupling to the write bit lines WBT_CM2, WBB_CM2 and the read bit line RBT_CM2. The pass gate circuit 412 includes the write pass gate circuit WPG2 and the read pass gate circuit RPG2 in FIG. 3. The feedback circuits PFC1-PFC2 are coupled to the read bit lines RBT_CM1 and RBT_CM2 respectively. The data access circuit 420 is coupled to the pass gate circuits 411-412 through the global write bit lines GWBT, GWBB and the global read bit line GRBT. The data access circuit 420 is configured to receive a data signal DIN (e.g., having data DATA[127:0]) from the latch circuit 430 and output a readout signal QINT (e.g., having data Q[127:0]) to the latch circuit 430. In some embodiments, the data access circuit 420 includes a sense amplifier (not shown) and one or more data latch circuits (not shown.) The latch circuit 430 is configured to latch data Q[127:0] in response to a latch enable signal LWE. In some embodiments, while the latch enable signal LWE is high, outputting the data Q[127:0] follows inputting the data DATA[127:0]. While the latch enable signal LWE is taken low, the data Q[127:0] is latched at the logic levels set up when the data DATA[127:0] is inputted.

The configurations of FIG. 4 are given for illustrative purposes. Various implements are within the contemplated scope of the present disclosure. For example, in some embodiments, the memory array 100 includes more than two columns, and the corresponding configurations are adjusted.

Figure 5A:
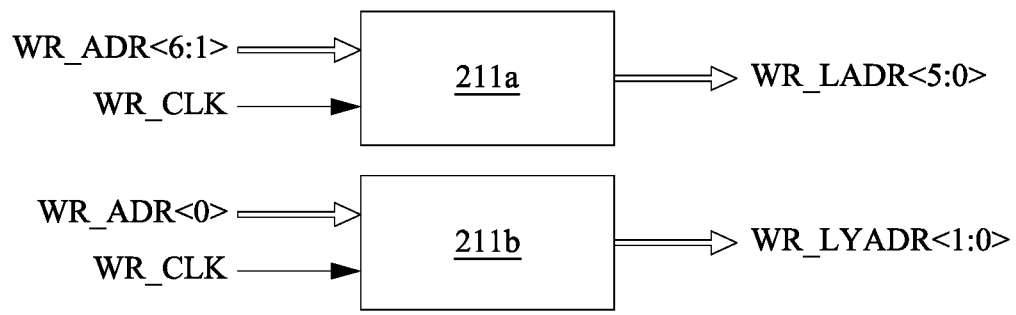
FIG. 5A is a schematic diagram of write address latches of a write address decoder in a control unit of the memory device in FIG. 4, in accordance with various embodiments of the present disclosure.

Reference is now made to FIG. 5A. FIG. 5A is a schematic diagram of write address latches 211a-211b of the write address decoder 211 in the control unit 200 of the memory device 10 in FIG. 4, in accordance with various embodiments of the present disclosure. In some embodiments, the write address decoder 211 includes the write address latches 211a-211b. The write address latch 211a is configured to latch the write word address WR_ADR<6:1> and to generate a data WR_LADR<5:0> (i.e., a 6-bit data) in response to the write clock signal WR_CLK. The write address latch 211b is configured to latch the write word address WR_ADR<0> and to generate a data WR_LYADR<1:0> in response to the write clock signal WR_CLK.

Figure 5B:
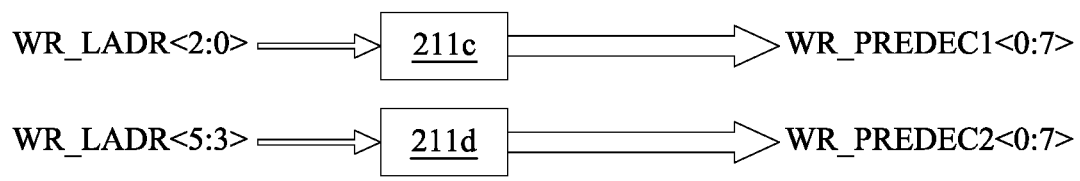
FIG. 5B is a schematic diagram of write address latches in the write address decoder, in accordance with various embodiments of the present disclosure.

Reference is now made to FIG. 5B. FIG. 5B is a schematic diagram of write address latches 211c-211d in the write address decoder 211, in accordance with various embodiments of the present disclosure. For illustration, the write address latch 211c is configured to latch the data WR_LADR<2:0> (i.e., a 3-bit data) corresponding to the data WR_LADR<5:0> and to generate a select data WR_PREDEC1<0:7> of the select signal WR_PREDEC. The write address latch 211d is configured to latch the data WR_LADR<5:3> (i.e., a 3-bit data) corresponding to the data WR_LADR<5:0> and to generate a select data WR_PREDEC2<0:7> of the select signal WR_PREDEC.

Figure 5C:
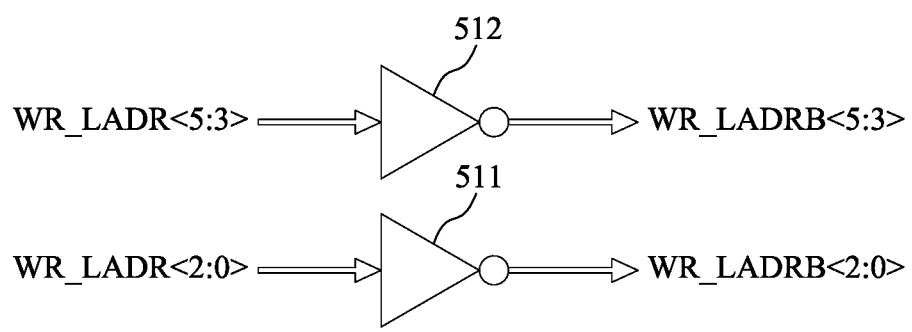
FIG. 5C is a schematic diagram of inverters in the write address decoder, in accordance with various embodiments of the present disclosure.

Reference is now made to FIG. 5C. FIG. 5C is a schematic diagram of inverters 511-512 in the write address decoder 211, in accordance with various embodiments of the present disclosure. For illustration, the inverter 511 is configured to invert logic states of bits in the data WR_LADR<2:0> to generate a data WR_LADRB<2:0>. The inverter 512 is configured to invert logic states of bits in the data WR_LADR<5:3> to generate a data WR_LADRB<5:3>.

Figure 5D:
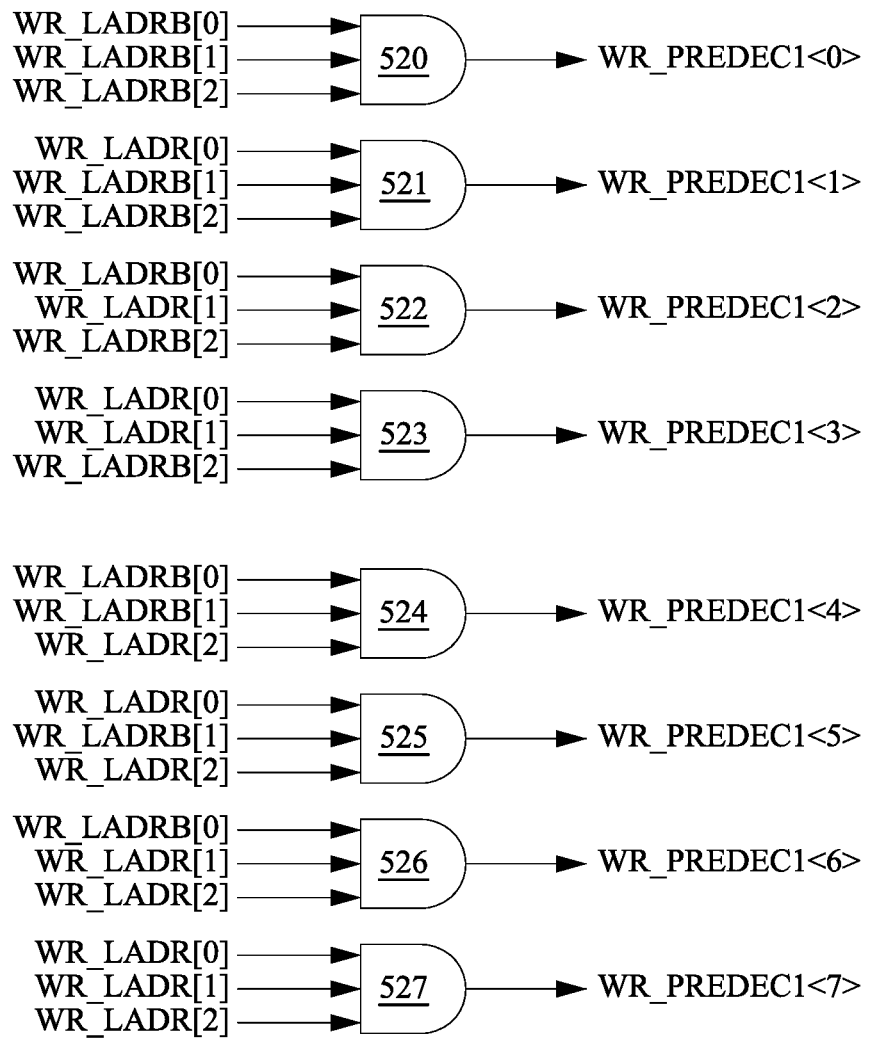
FIG. 5D is a schematic detailed diagram of the write address latch in the write address decoder, in accordance with various embodiments of the present disclosure.

Reference is now made to FIG. 5D. FIG. 5D is a schematic diagram of detailed diagram of the write address latch 211c in the write address decoder 211, in accordance with various embodiments of the present disclosure. For illustration, the write address latch 211c of FIG. 5B includes AND gates 520-527. Each of the AND gates 520-527 is configured to generate a bit of the select data WR_PREDEC1<0:7> according to the bit data of the data WR_LADR<2:0> and the data WR_LADRB<2:0>. For example, the AND gate 520 receives bits WR_LADRB[0], WR_LADRB[1], and WR_LADRB[2] of the data WR_LADRB<2:0> and generates a bit WR_PREDEC1<0> of the select data WR_PREDEC1<0:7>. The configurations of other bits of select data WR_PREDEC1<0:7> are similar to that of the bit WR_PREDEC1<0>. Hence, the repetitious descriptions are omitted here.

Figure 5E:
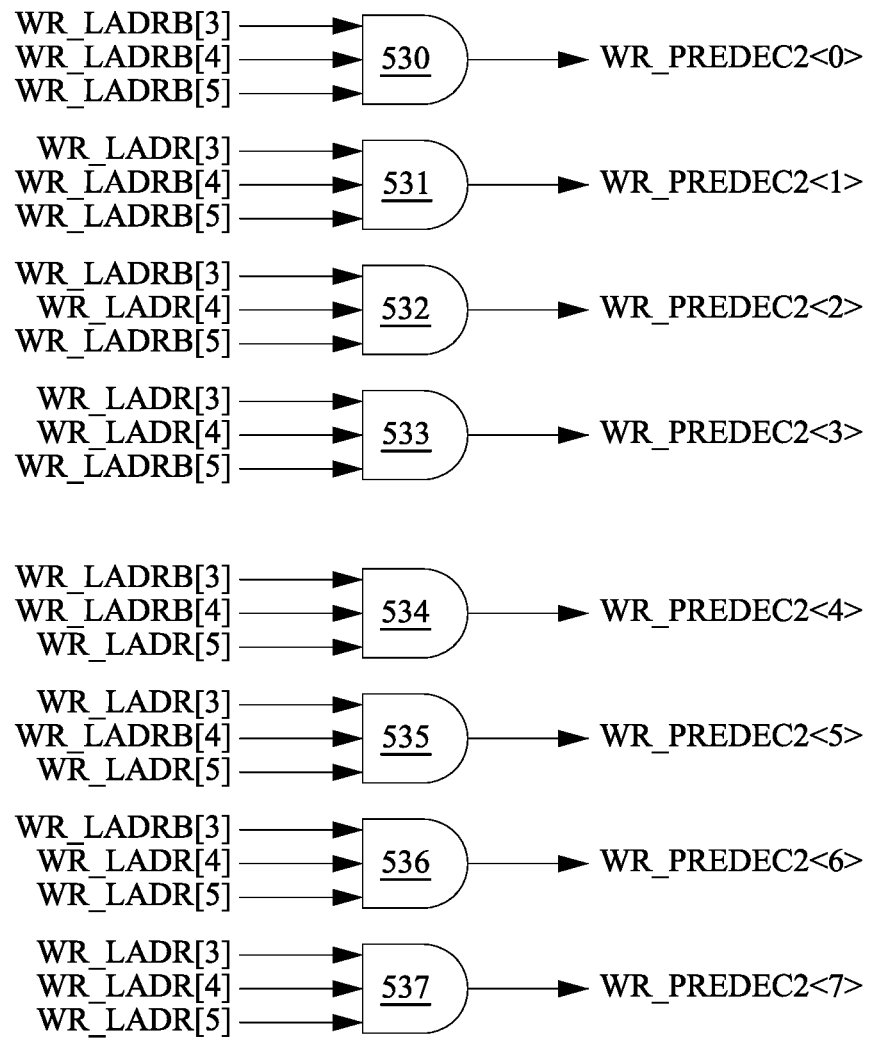
FIG. 5E is a schematic detailed diagram of the write address latch in the write address decoder, in accordance with various embodiments of the present disclosure.

Reference is now made to FIG. 5E. FIG. 5E is a schematic diagram of detailed diagram of the write address latch 211d in the write address decoder 211, in accordance with various embodiments of the present disclosure. For illustration, the write address latch 211d of FIG. 5B includes AND gates 530-537. Each of the AND gates 530-537 is configured to generate a bit of the select data WR_PREDEC2<0:7> according to the bit data of the data WR_LADR<5:3> and the data WR_LADRB<5:3>. For example, the AND gate 530 receives bits WR_LADRB[3], WR_LADRB[4], and WR_LADRB[5] of the data WR_LADRB<5:3> and generates a bit WR_PREDEC2<0> of the select data WR_PREDEC2<0:7>. The configurations of other bits of the select data WR_PREDEC2<0:7> are similar to that of the bit WR_PREDEC2<0>. Hence, the repetitious descriptions are omitted here.

Figure 5F:
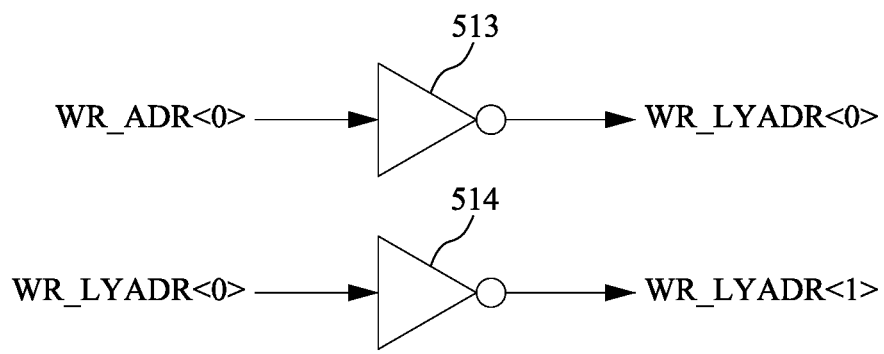
FIG. 5F is a schematic diagram of inverters of the write address latch in the write address decoder, in accordance with various embodiments of the present disclosure.

Reference is now made to FIG. 5F. FIG. 5F is a schematic diagram of inverters 513-514 of the write address latch 211b in the write address decoder 211, in accordance with various embodiments of the present disclosure. For illustration, the write address decoder 211 includes the inverters 513-514. In some embodiments, the inverter 513 is configured to invert a logic state of the write word address WR_ADR<0> to generate a bit WR_LYADR<0> of the data WR_LYADR<1:0>. The inverter 514 is configured to invert a logic state of the bit WR_LYADR<0> of the data WR_LYADR<1:0> to generate a bit WR_LYADR<1>.

Figure 5G:
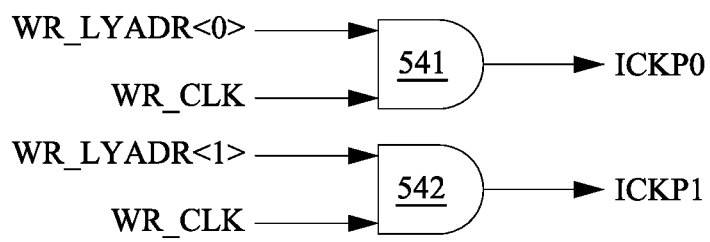
FIG. 5G is a schematic diagram of a write clock generator, in accordance with various embodiments of the present disclosure.

Reference is now made to FIG. 5G. FIG. 5G is a schematic diagram of a write clock generator 212, in accordance with various embodiments of the present disclosure. For illustration, the write clock generator 212 includes AND gates 541-542. In some embodiments, the AND gate 541 is configured to generate the write clock signal ICKP0 based on the bit WR_LYADR<0> and the write clock signal WR_CLK. The AND gate 542 is configured to generate the write clock signal ICKP1 based on the bit WR_LYADR<1> and the write clock signal WR_CLK. Alternatively stated, the write clock signals ICKP0-ICKP1 have different logic values.

Figure 6A:
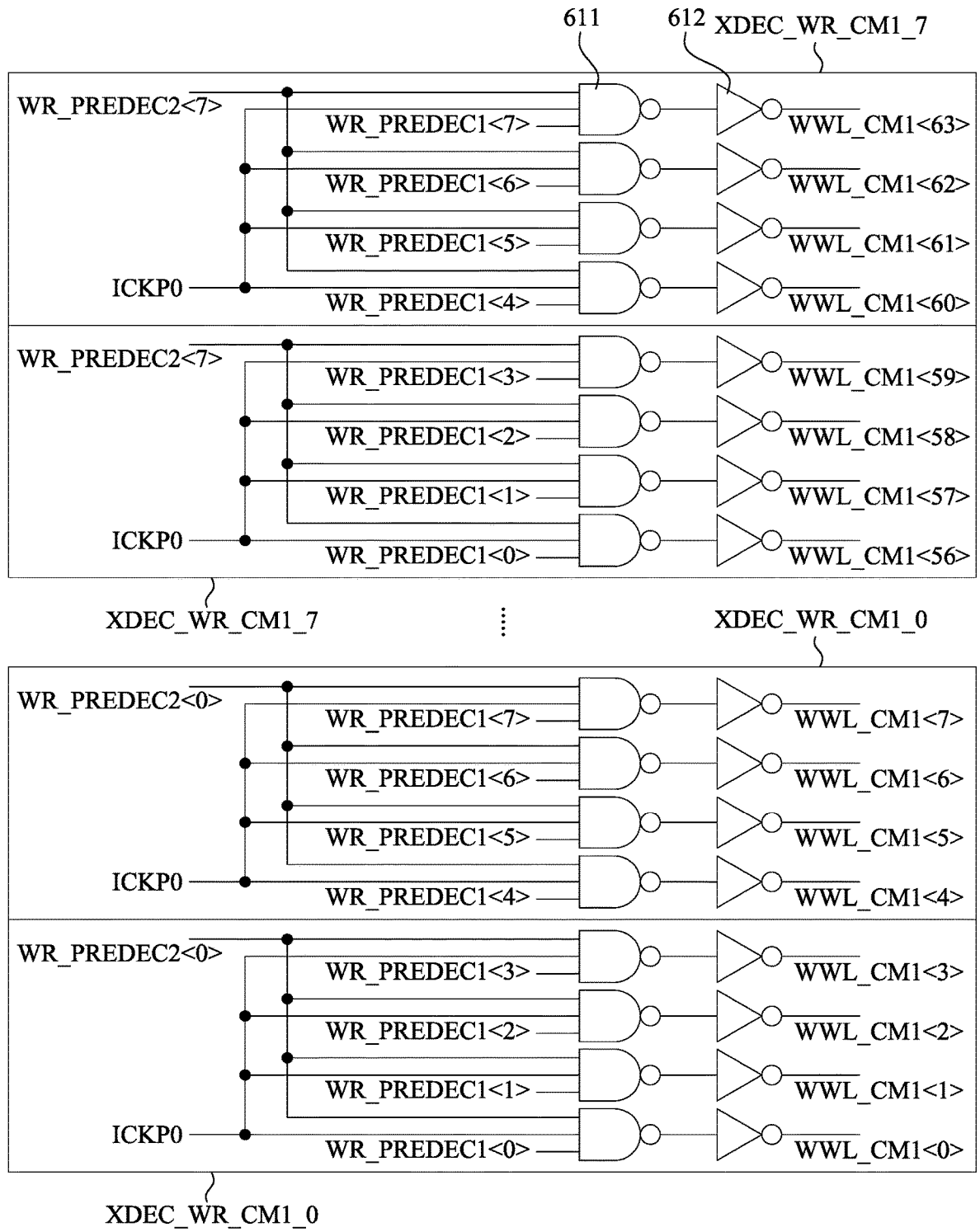
FIG. 6A is a schematic diagram of post decoders in the memory device, in accordance with other embodiments of the present disclosure.

As mentioned above, the signals generated by the control unit 200 is transmitted to the post decoders in the post decoder circuit 300 for generating write signals to control the memory array 100. Reference is now made to FIG. 6A. FIG. 6A is a schematic diagram of the post decoders XDEC_WR_CM1_0-XDEC_WR_CM1_7 in the memory device 10, in accordance with other embodiments of the present disclosure. For generating write signals to control the memory cells in the first column, the post decoders XDEC_WR_CM1_0-XDEC_WR_CM1_7 include NAND gates 611 and inverters 612 coupled to the NAND gates 611. In some embodiments, each of the post decoders XDEC_WR_CM1_0-XDEC_WR_CM1_7 receives the select signal WR_PREDEC and the write clock signal ICKP0 and generates 8 write signals. For example, the NAND gate 611 receives the bit WR_PREDEC1<0> of the select data WR_PREDEC1<0:7>, the bit WR_PREDEC2<0> of the select data WR_PREDEC2<0:7>, and the write clock signal ICKP0. An output terminal of the NAND gate 611 is coupled to an input terminal of the inverter 612. The inverter 612 further inverts an output of the NAND gate 611 to output the write signal WWL_CM1<0>. The configurations of post decoders XDEC_WR_CM1_1-XDEC_WR_CM1_7 are similar to that of XDEC_WR_CM1_0. Hence, the repetitious descriptions are omitted here.

Figure 6B:
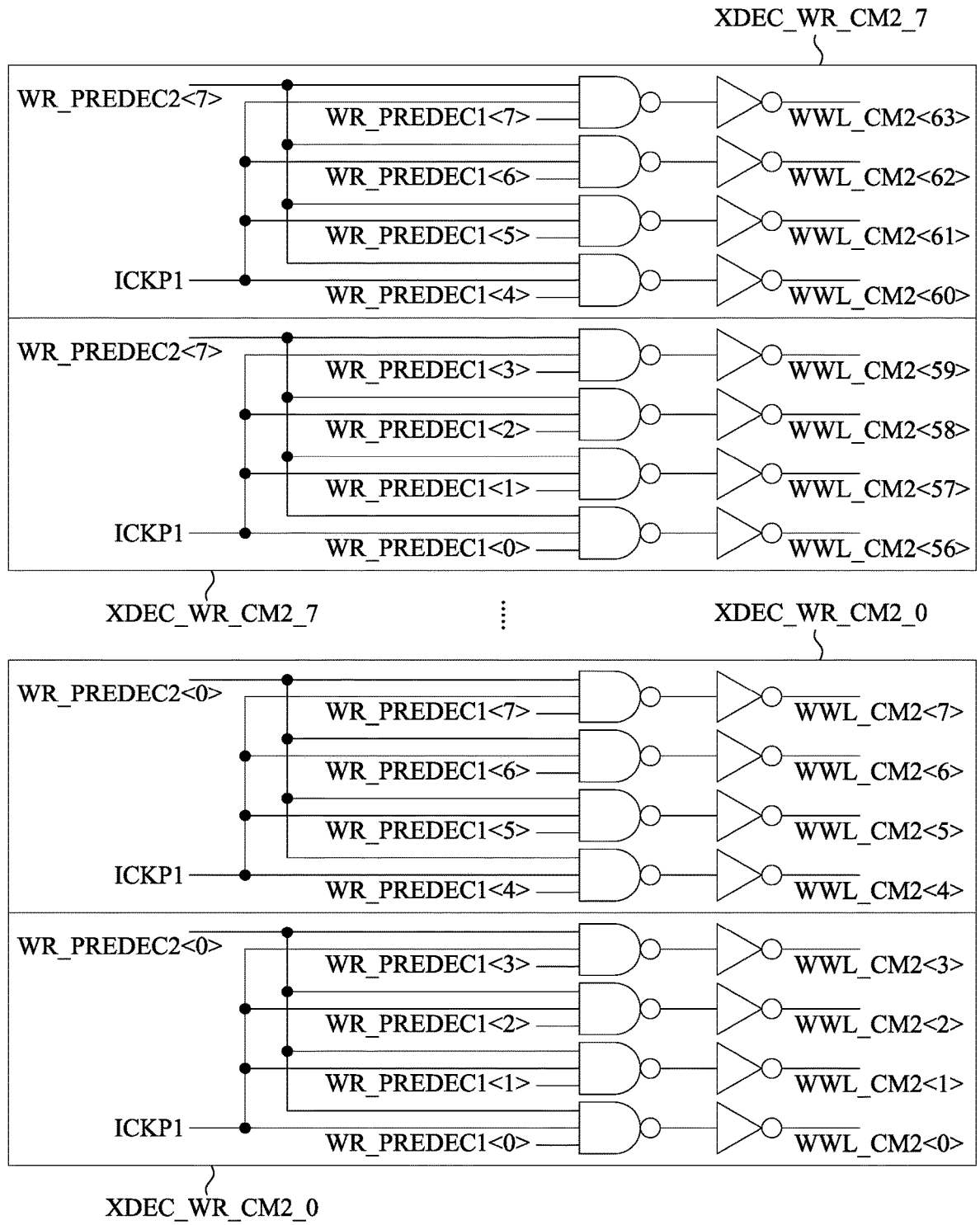
FIG. 6B is a schematic diagram of post decoders in the memory device, in accordance with other embodiments of the present disclosure.

Reference is now made to FIG. 6B. FIG. 6B is a schematic diagram of the post decoders XDEC_WR_CM2_0-XDEC_WR_CM2_7 in the memory device 10, in accordance with other embodiments of the present disclosure. With respect to the embodiments of FIGS. 1-6A, like elements in FIG. 6B are designated with the same reference numbers for ease of understanding.

Compared with FIG. 6A, for generating write signals to control the memory cells in the second column, as shown in FIG. 6B, instead of receiving the write clock signal ICKP0, the post decoders XDEC_WR_CM2_0-XDEC_WR_CM2_7 are configured to generate the write signals WWL_CM2<0>-WWL_CM2<63> in response to the write clock signal ICKP1.

Based on the disclosure above, in a write operation performed to the memory array 100, for example, the write word address WR_ADR<6:0> is 1111111. Because the write word address WR_ADR<0> is "1", the write clock signal WR_CLK is correspondingly high and the write clock signals ICKP0 and ICKP1 are "0" and "1" respectively. Accordingly, the write signals WWL_CM1<63:0> is "0". Alternatively stated, the first column is unselected and the second column is selected. In addition, the bit WR_PREDEC2<7> of the select data WR_PREDEC2<0:7> is "1", and the post decoder XDEC_WR_CM2_7 is selected. The bit WR_PREDEC1<7> of the select data WR_PREDEC1<0:7> is "1". Therefore, the write signal WWL_CM2<63> is selected and has a logic state "1". The memory cell MC_2,63 is activated in response to the write signal WWL_CM2<63> for the write operation. Alternatively stated, based on the write word address, one column of the columns in the memory array 100 is selected.

The configurations of FIGS. 5A-6B are given for illustrative purposes. Various implements are within the contemplated scope of the present disclosure. For example, in some embodiments, there are more than two columns in the memory array 100, and the write word address is adjusted correspondingly.

Figure 7A:
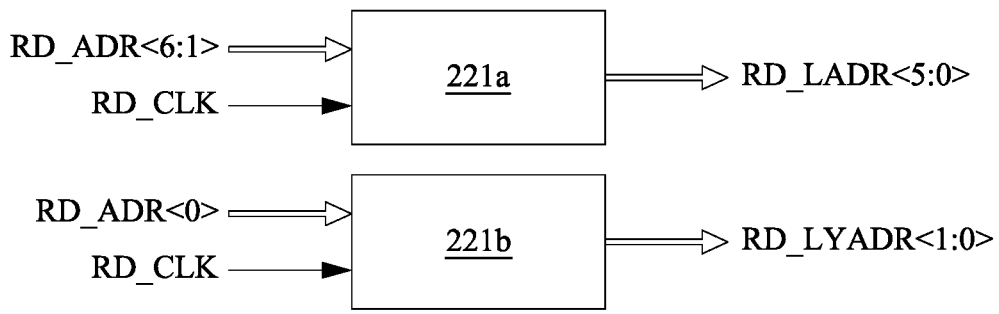
FIG. 7A is a schematic diagram of read address latches of a read address decoder in the control unit of the memory device in FIG. 4, in accordance with various embodiments of the present disclosure.

In some embodiments, the configurations of the read control circuit 220 are similar to that of the write control circuit 210. Reference is now made to FIG. 7A. FIG. 7A is a schematic diagram of read address latches 221a-221b of the read address decoder 221 in the control unit 200 of the memory device 10 in FIG. 4, in accordance with various embodiments of the present disclosure. In some embodiments, the read address decoder 211 includes the read address latches 211a-211b. The read address latch 211a is configured to latch the read word address RD_ADR<6:1> and to generate a data RD_LADR<5:0> (i.e., a 6-bit data) in response to the read clock signal RD_CLK. The read address latch 211b is configured to latch the read word address RD_ADR<0> and to generate a data RD_LYADR<1:0> in response to the read clock signal RD_CLK.

Figure 7B:
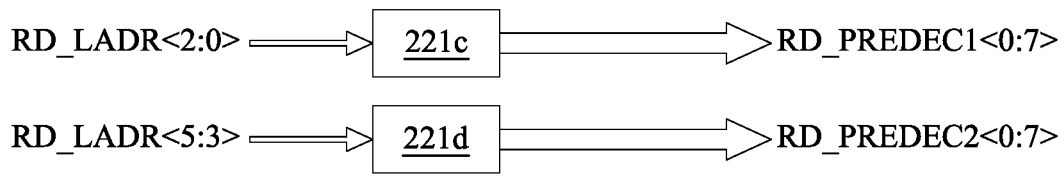
FIG. 7B is a schematic diagram of read address latches in the read address decoder, in accordance with various embodiments of the present disclosure.

Reference is now made to FIG. 7B. FIG. 7B is a schematic diagram of read address latches 221c-221d in the read address decoder 221, in accordance with various embodiments of the present disclosure. For illustration, the read address latch 221c is configured to latch the data RD_LADR<2:0> (i.e., a 3-bit data) corresponding to the data RD_LADR<5:0> and to generate a select data RD_PREDEC1<0:7> of the select signal RD_PREDEC. The read address latch 221d is configured to latch the data RD_LADR<5:3> (i.e., a 3-bit data) corresponding to the data RD_LADR<5:0> and to generate a select data RD_PREDEC2<0:7> of the select signal RD_PREDEC.

Figure 7C:
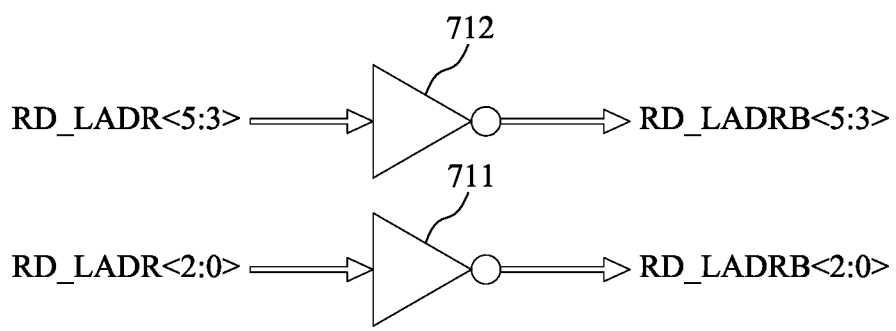
FIG. 7C is a schematic diagram of inverters in the read address decoder, in accordance with various embodiments of the present disclosure.

Reference is now made to FIG. 7C. FIG. 7C is a schematic diagram of inverters 711-712 in the read address decoder 221, in accordance with various embodiments of the present disclosure. For illustration, the inverter 711 is configured to invert logic states of bits in the data RD_LADR<2:0> to generate a data RD_LADRB<2:0>. The inverter 712 is configured to invert logic states of bits in the data RD_LADR<5:3> to generate a data RD_LADRB<5:3>.

Figure 7D:
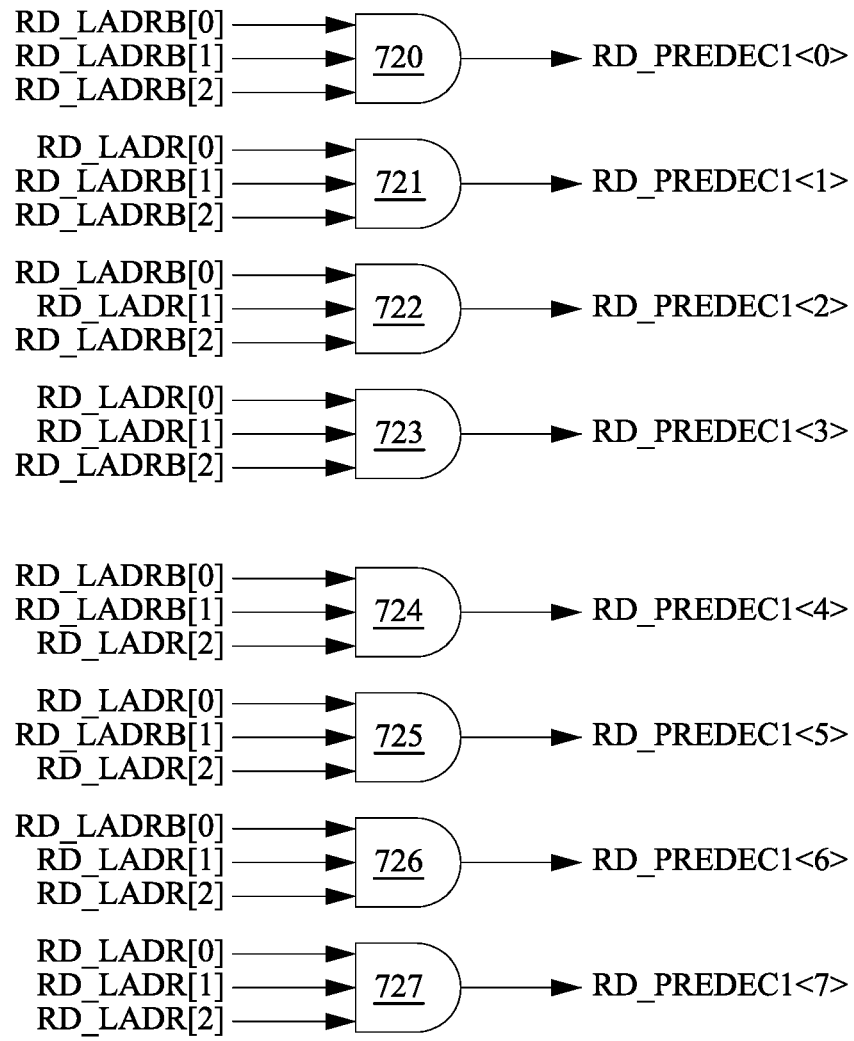
FIG. 7D is a schematic detailed diagram of the read address latch in the read address decoder, in accordance with various embodiments of the present disclosure.

Reference is now made to FIG. 7D. FIG. 7D is a schematic diagram of detailed diagram of the read address latch 221c in the read address decoder 221, in accordance with various embodiments of the present disclosure. For illustration, the read address latch 221c of FIG. 7B includes AND gates 720-727. Each of the AND gates 720-727 is configured to generate a bit of the select data RD_PREDEC1<0:7> according to the bit data of the data RD_LADR<2:0> and the data RD_LADRB<2:0>. For example, the AND gate 720 receives bits RD_LADRB[0], RD_LADRB[1], and RD_LADRB[2] of the data RD_LADRB<2:0> and generates a bit RD_PREDEC1<0> of the select data RD_PREDEC1<0:7>. The configurations of other bits of select data RD_PREDEC1<0:7> are similar to that of the bit RD_PREDEC1<0>. Hence, the repetitious descriptions are omitted here.

Figure 7E:
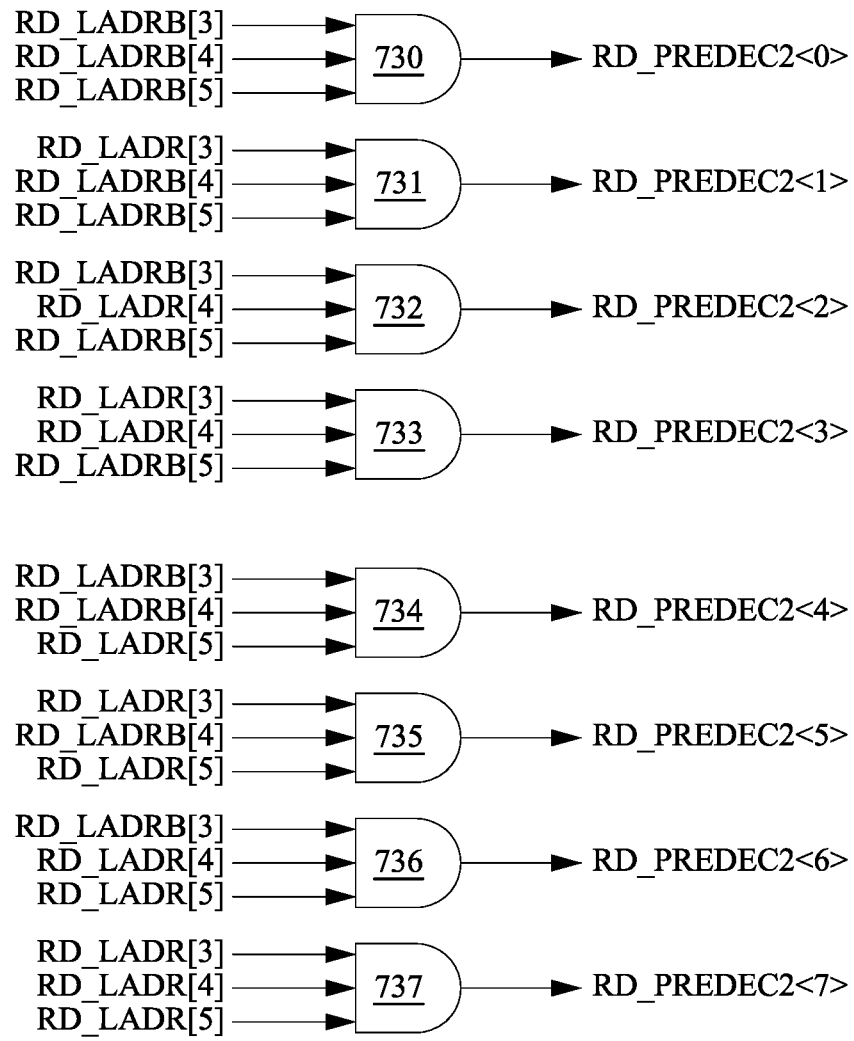
FIG. 7E is a schematic detailed diagram of the read address latch in the read address decoder, in accordance with various embodiments of the present disclosure.

Reference is now made to FIG. 7E. FIG. 7E is a schematic diagram of detailed diagram of the read address latch 221d in the read address decoder 221, in accordance with various embodiments of the present disclosure. For illustration, the read address latch 221d of FIG. 7B includes AND gates 730-737. Each of the AND gates 730-737 is configured to generate a bit of the select data RD_PREDEC2<0:7> according to the bit data of the data RD_LADR<5:3> and the data RD_LADRB<5:3>. For example, the AND gate 730 receives bits RD_LADRB[3], RD_LADRB[4], and RD_LADRB[5] of the data RD_LADRB<5:3> and generates a bit RD_PREDEC2<0> of the select data RD_PREDEC2<0:7>. The configurations of other bits of the select data RD_PREDEC2<0:7> are similar to that of the bit RD_PREDEC2<0>. Hence, the repetitious descriptions are omitted here.

Figure 7F:
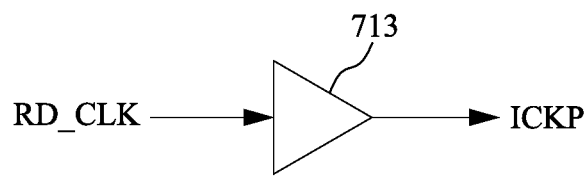
FIG. 7F is a schematic diagram of a read clock generator, in accordance with various embodiments of the present disclosure.

Reference is now made to FIG. 7F. FIG. 7F is a schematic diagram of the read clock generator 222, in accordance with various embodiments of the present disclosure. For illustration, the read clock generator 222 includes a buffer 713. In some embodiments, the buffer 713 is configured to generate the read clock signal ICKP based on the read clock signal RD_CLK.

Figure 8:
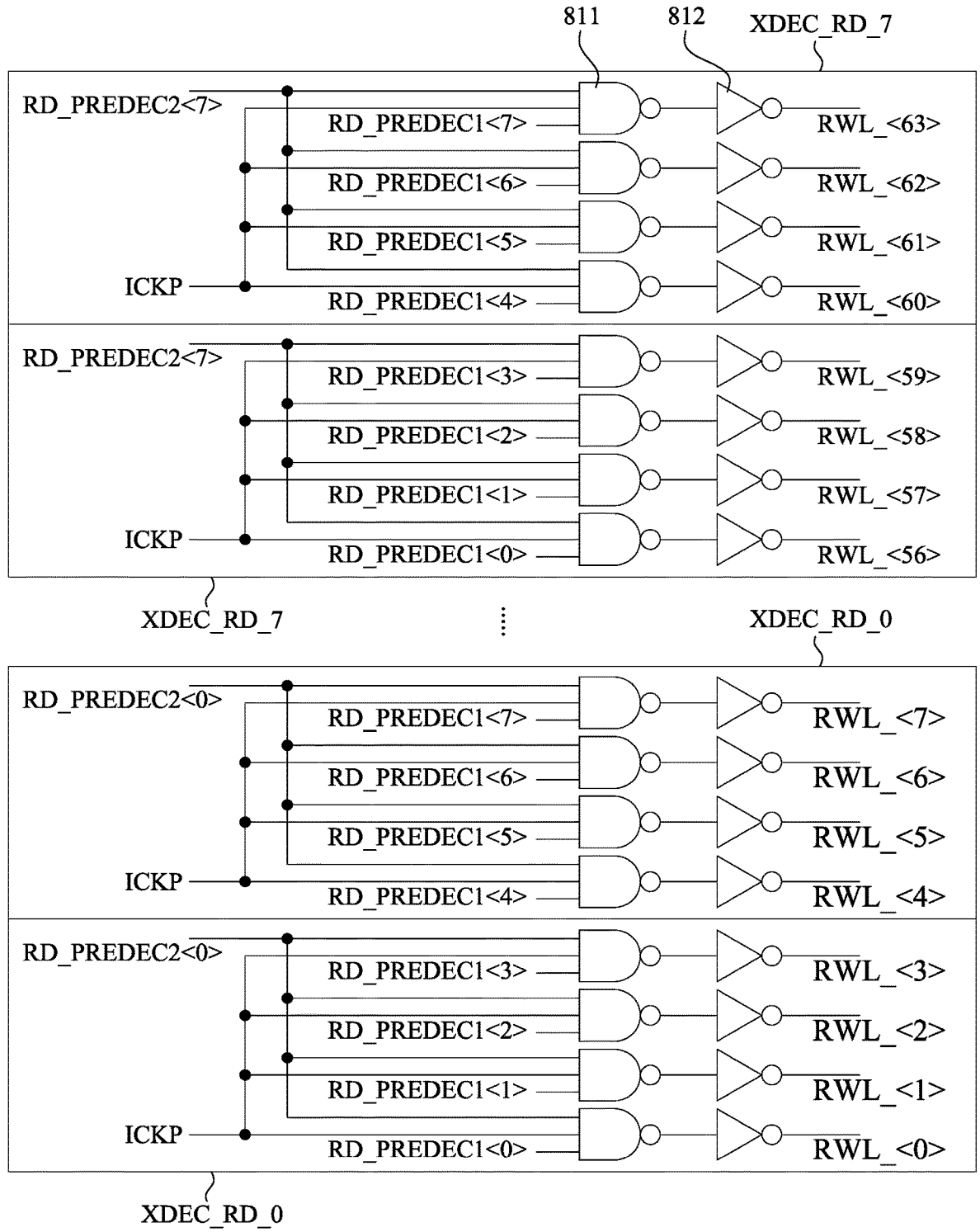
FIG. 8 is a schematic diagram of post decoders in the memory device, in accordance with other embodiments of the present disclosure.

As mentioned above, the signals generated by the control unit 200 is transmitted to the post decoders in the post decoder circuit 300 for generating read signals to control the memory array 100. Reference is now made to FIG. 8. FIG. 8 is a schematic diagram of the post decoders XDEC_RD_0-XDEC_RD_7 in the memory device 10, in accordance with other embodiments of the present disclosure. For generating read signals to control the memory cells in both of the first column and the second column, the post decoders XDEC_RD_0-XDEC_RD_7 include NAND gates 811 and inverters 812 coupled to the NAND gates 811. In some embodiments, each of the post decoders XDEC_RD_0-XDEC_RD_7 receives the select signal RD_PREDEC and the read clock signal ICKP and generates 8 read signals. For example, the NAND gate 811 receives the bit RD_PREDEC<0> of the select data RD_PREDEC1<0:7>, the bit RD_PREDEC2<0> of the select data RD_PREDEC2<0:7>, and the read clock signal ICKP. An output terminal of the NAND gate 811 is coupled to an input terminal of the inverter 812. The inverter 812 further inverts an output of the NAND gate 811 to output the read signal RWL_<0>. The configurations of post decoders XDEC_RD_1-XDEC_RD_7 are similar to that of XDEC_RD_0. Hence, the repetitious descriptions are omitted here.

Based on the disclosure above, in a read operation performed to the memory array 100, for example, the read word address RD_ADR<6:0> is 1111111. When the read word address RD_ADR<0> is "1" and the read clock signal RD_CLK is high, the read clock signal ICKP is "1". In addition, the bit RD_PREDEC2<7> of the select data RD_PREDEC2<0:7> is "1", and the post decoder XDEC_RD_7 is selected. The bit RD_PREDEC1<7> of the select data RD_PREDEC1<0:7> is "1". Therefore, the read signal RWL_<63> is selected and has a logic state "1". The memory cells MC_1,63 and MC_2,63 are activated in response to the read signal RWL_<63> for the read operation. One of the memory cells MC_1,63 and MC_2,63 is further selected to be accessed according to precharge signals. The detail will be discussed in the following paragraphs.

The configurations of FIGS. 7A-8 are given for illustrative purposes. Various implements are within the contemplated scope of the present disclosure. For example, in some embodiments, the memory cells in the same row and different columns are coupled to different read word lines. The configurations for decoding the read word address are adjusted correspondingly and similar to that of the write word address.

Figures 9A, 9B:
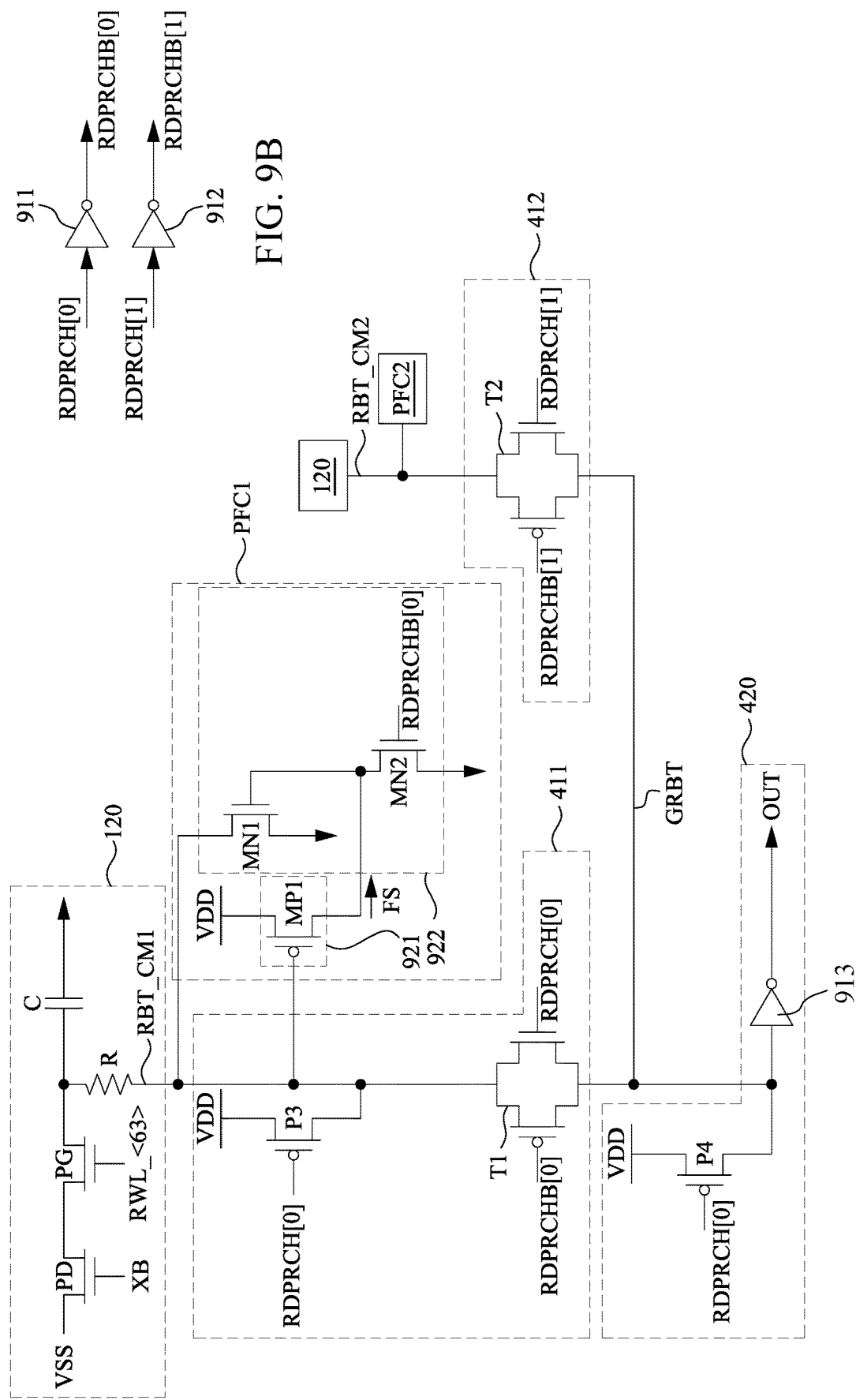
FIG. 9A is a schematic diagram of a read port circuit, feedback circuits, part of pass gate circuits, and part of a data access circuit, in accordance with other embodiments of the present disclosure.
FIG. 9B is a schematic diagram of inverters in the control unit of the memory device, in accordance with other embodiments of the present disclosure.

Reference is now made to FIG. 9A. FIG. 9A is a schematic diagram of the read port circuits 120, the feedback circuits PFC1-PFC2, part of the read pass circuits 411-412, and part of the data access circuit 420, in accordance with other embodiments of the present disclosure. With respect to the embodiments of FIGS. 1-8, like elements in FIG. 9A are designated with the same reference numbers for ease of understanding.

For illustration, the read port circuit 120 of one memory cells MC in the first column of FIG. 4 is coupled to the pass gate circuit 411 and the feedback circuit PFC1 through the read bit line RBT_CM1, and the read port circuit 120 of one memory cells MC in the second column of FIG. 4 is coupled to the pass gate circuit 412 and the feedback circuit PFC2 through the read bit line RBT_CM2. In some embodiments, the data access circuit 420 is configured to generate an output signal OUT for determining the stored data in the memory cell according to the received signal in the global read bit line GRBT, as shown in FIG. 9A. In some embodiments, the data access circuit 420 further includes other elements, which are omitted for simplicity here, for determination of the stored data.

The read port circuit 120 includes a parasitic resistor R and a parasitic capacitor C that are coupled to the read bit line RBT_CM1. In some embodiments, the parasitic resistor R and the parasitic capacitor C correspond to the resistance and the capacitance, respectively, contributed by metal routing of the read port circuit 120 and the read bit line RBT.

In some embodiments, the pass gate circuits 411-412 include transmission gates T1-T2 respectively. In a read operation, the transmission gate T1 is configured to be turned on in respect read precharge signals RDPRCH[0] and RDPRCHB[0], and the transmission gate T2 is configured to be turned on in response to read precharge signals RDPRCH[1] and RDPRCHB[1]. In some embodiments, the read precharge signals RDPRCH[0]-RDPRCH[1] having different logic values are generated by a column decoder (not shown) based on the data RD_ADR<0> and the read clock signal RD_CLK. As shown in FIG. 9A, when the memory cell in the first column is selected to be accessed, the read precharge signal RDPRCH[0] has a logic "1" and the read precharge signal RDPRCH[1] has a logic "0". Accordingly, the read bit line RBT_CM1 is selected to be electrically coupled to the data access circuit 410, and the data stored in the memory cell in the first column is read.

In some embodiments, the read precharge signals RDPRCHB[0]-RDPRCHB[1] are generated by the control unit 200. Reference is now made to FIG. 9B. FIG. 9B is a schematic diagram of the inverters 911-912 in the control unit 200 of the memory device, in accordance with other embodiments of the present disclosure. For illustration, the read precharge signal RDPRCHB[0] is outputted by inverting the read precharge signal RDPRCH[0] an inverter 911, and the read precharge signal RDPRCHB[1] is outputted by inverting the read precharge signal RDPRCH[1] an inverter 912, as shown in FIG. 9B.

As shown in FIG. 9A, the feedback circuit PFC1 includes a sensing unit 921 and a pull-down circuit 922. The sensing unit 921 includes a p-type transistor MP1. The pull-down circuit 9211 includes n-type transistors MN1-MN2. A first terminal of the transistor MP1 is coupled to the supply voltage VDD. A second terminal of the transistor MP1 is coupled to a control terminal of the transistor MN1 and a first terminal of the transistor MN2. A control terminal of the transistor MP1 is coupled to the read bit line RBT_CM1. A first terminal of the transistor MN1 is coupled to the read bit line RBT_CM1. Second terminals of the transistors MN1-MN2 are coupled to the ground (the supply voltage VSS which is smaller than the supply voltage VDD, in some embodiments.) A control terminal of the transistor MN2 receives the read precharge signal RDPRCHB[0]. Alternatively stated, the feedback circuit PFC is coupled between the read bit line RBT_CM1 and the ground.

In some embodiments of performing a read operation to the memory cell, for example, MC_1,63 which is in the first column and latching a logic "0" (i.e., a low logic state) at its storage node XT, when the logic value of the storage node XB is "1" and the read signal RWL_<63> is "1", the transistors PD and PG are turned on correspondingly. When the read precharge signal RDPRCH[0] is "1" and a transistor P3 (also referred to as a read control gate configured to precharge the read bit line in response to the read precharge signal RDPRCH[0]) in the pass gate circuit 411 is turned off, the read bit line RBT_CM1 is discharged through a discharge path formed by the transistors PD and PG.

In some embodiments, when a voltage level of the read bit line RBT_CM1 drops from the supply voltage VDD to a first voltage level, such as about 80% of the supply voltage VDD, the feedback circuit PFC1 is configured to be turned on, in response to the first voltage level, to discharge the read bit line RBT_CM1 to have a second voltage level, such as about 50% or lower than 50% of the supply voltage VDD. For illustration, the sensing unit 921 is configured to be turned on in response to the decreasing voltage level of the read bit line RBT_CM1, and to output the supply voltage VDD as a feedback signal FS (i.e., having logic high "1") to the pull-down circuit 922. Furthermore, the transistor MN1-MN2 in the pull-down circuit 922 are configured to be turned on and turned off in response to the feedback signal FS and the read precharge signal RDPRCHB[0] (i.e., having logic "0") respectively, and to discharge charges of the read bit line RBT_CM1 from the first terminal of the transistor MN1 to the ground.

In some embodiments, the feedback circuits PFC1-PFC2 have similar configurations. Compared with the feedback circuit PFC1 operating in response to the read precharge signal RDPRCHB[0], the feedback circuit PFC2 operates in response to the read precharge signal RDPRCHB[1] having a logic value different from that of the read precharge signal RDPRCHB[0]. Furthermore, when the read bit line RBT_CM1 is selected to be accessed, a voltage level of the read bit line RBT_CM2 remains and does not decrease. Accordingly, when the feedback circuit PFC1 is tuned on in response to the decreasing voltage level of the read bit line RBT_CM2, the feedback circuit PFC is turned off.

With the configurations of the present disclosure, the feedback circuit PFC is utilized to discharge the read bit line RBT in addition to the read port circuit. In contrast, an increased bit line resistance results in delayed read operation speed in some approaches without the feedback circuit PFC. In such approaches, the read bit line discharges in a very low speed. Accordingly, the memory device of the present disclosure provides improved read path and better read operation speed, compared with some approaches.

The configurations of FIGS. 9A-9B are given for illustrative purposes. Various implements are within the contemplated scope of the present disclosure. For example, in some embodiments, the pass gate circuit 412 includes a P-type transistor which is configured with respect to the transistor P3 and coupled to the read bit line RBT_CM2.

Figure 10:
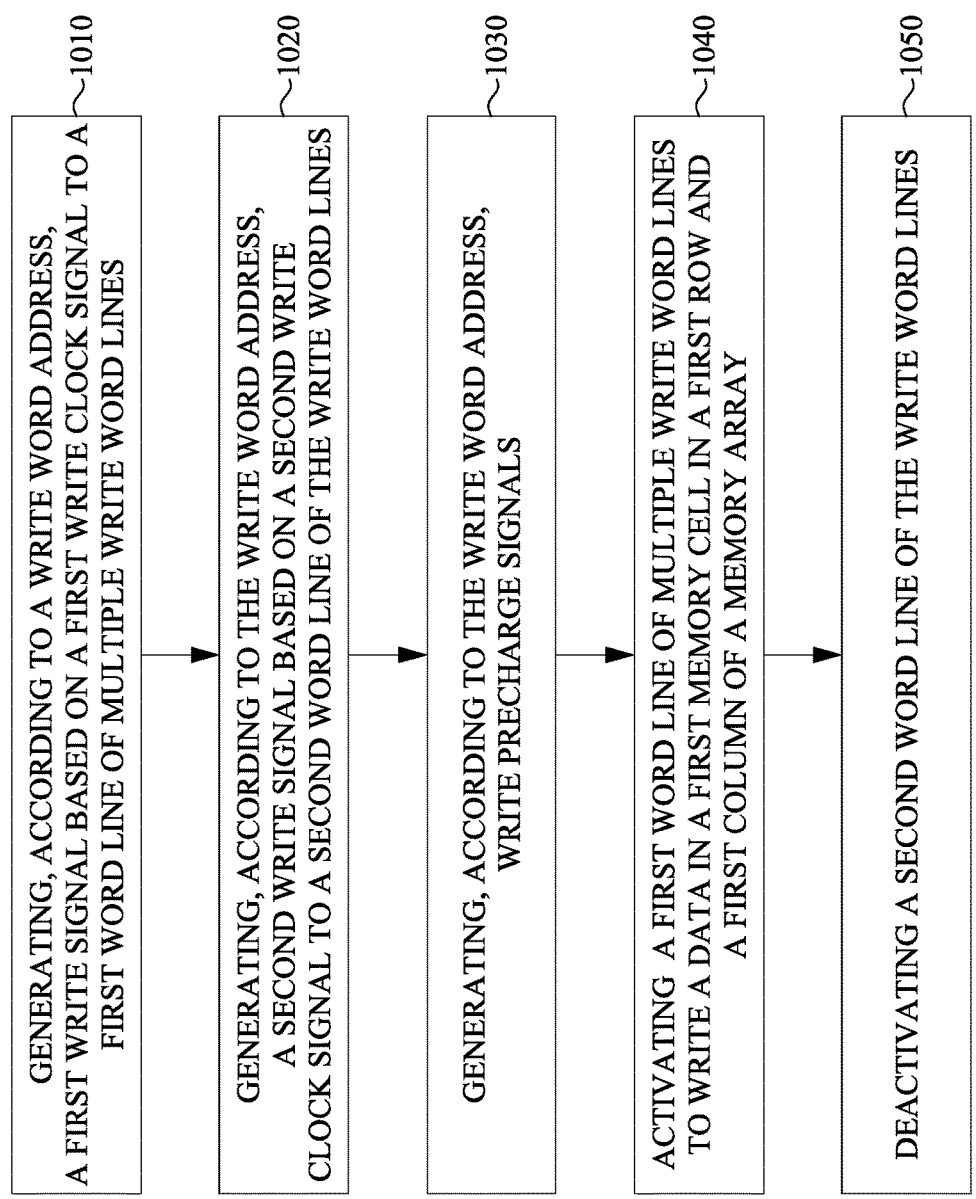
FIG. 10 is a flowchart of a method for operating a memory device to perform a write operation, in accordance with some embodiments of the present disclosure.
Figure 11:
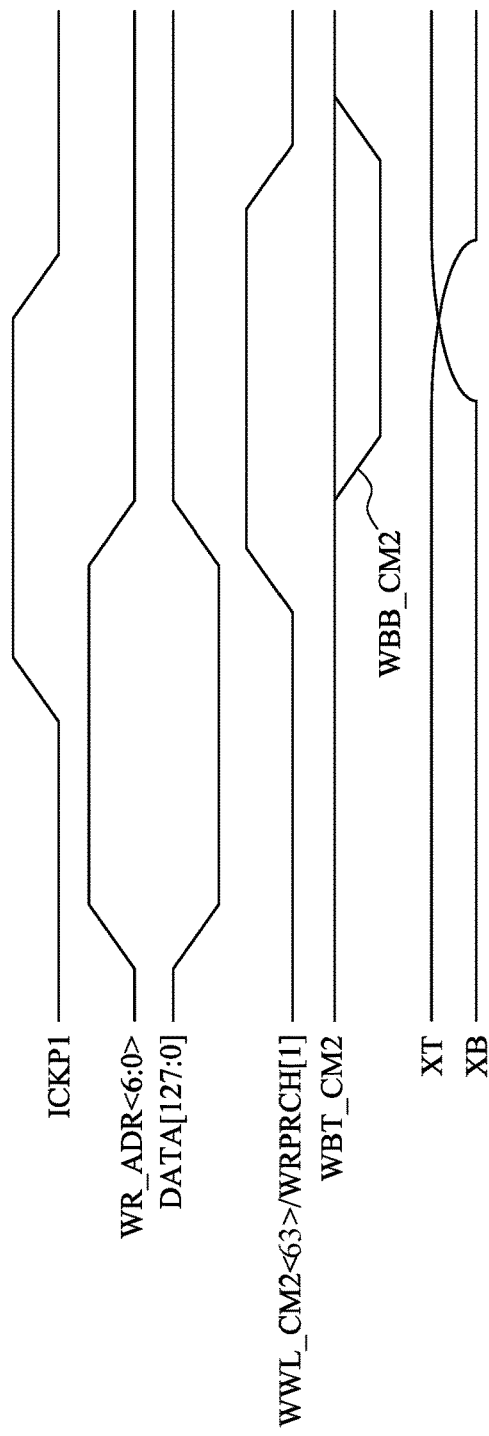
FIG. 11 illustrates waveforms of signals in the memory device operating corresponding to the method in FIG. 10, in accordance with some embodiments of the present disclosure.

Reference is now made to FIGS. 10-11. FIG. 10 is a flow chart of the method 1000 operating a memory device to perform a write operation, in accordance with some embodiments of the present disclosure. FIG. 11 illustrates waveforms of signals in the memory device operating corresponding to the method in FIG. 10, in accordance with some embodiments of the present disclosure. It is understood that additional operations can be provided before, during, and after the processes shown by FIG. 10, and some of the operations described below can be replaced or eliminated, for additional embodiments of the method. The order of the operations/processes may be interchangeable. Throughout the various views and illustrative embodiments, like reference numbers are used to designate like elements. The method 1000 includes operations 1010-1050 that are described below with reference to the memory device 10 and the waveforms in FIG. 11.

In operation 1010, the write signal WWL_CM2<63> is generated according to the write word address WR_ADR<6:0> and based on the write clock signal ICKP0 to the write word line WWL_CM2<63>. In some embodiments, as shown in FIG. 11, the write word address WR_ADR<6:0> and the data DATA[127:0] are inputted and the write signal WWL_CM2<63> is generated to have a high state when the write clock signal ICKP1 goes high.

In operation 1020, the write signal, for example, the write signal WWL_CM1<63> is generated according to the write word address WR_ADR<6:0> and based on the write clock signal ICKP0 to the write word line WWL_CM1<63>. In some embodiments, the write clock signals ICKP0-ICKP1 are out-of-phase.

In operation 1030, write precharge signals WRPRCH[0]-WRPRCH[1] are generated. In some embodiments, the write precharge signals WRPRCH[0]-WRPRCH[1] having different logic values are generated by a column decoder (not shown) based on the data WR_ADR<0> and the write clock signal WR_CLK. The write precharge signals WRPRCH[0]-WRPRCH[1] is transmitted to the pass gate circuits 411-412 to select the pair of the write bit lines WBT_CM1 and WBB_CM1 or the pair of the write bit lines WBT_CM2 and WBB_CM2 for the write operation. As shown in FIG. 11, the write precharge signal WRPRCH[1] goes high and the pair of the write bit lines WBT_CM2 and WBB_CM2 are selected.

In some embodiments, for the write operation, the read precharge signals RDPRCH[0]-RDPRCH[1] and RDPRCHB[0]-RDPRCHB[1] have a logic "0".

In operation 1040, the write word line WWL_CM2<63> is activated to write the data DATA[127:0] (i.e., a logic "0") in the memory cell MC_2,63 in the 64th row and the second column of the memory array 10. As shown in FIG. 11, the voltage level of the storage node XT turns from a high level to a low level, and the voltage level of the storage node XB turns from a low level to a high level.

In operation 1050, the write word line WWL_CM1<63> is deactivated when the write word line WWL_CM2<63> is activated.

Figure 12:
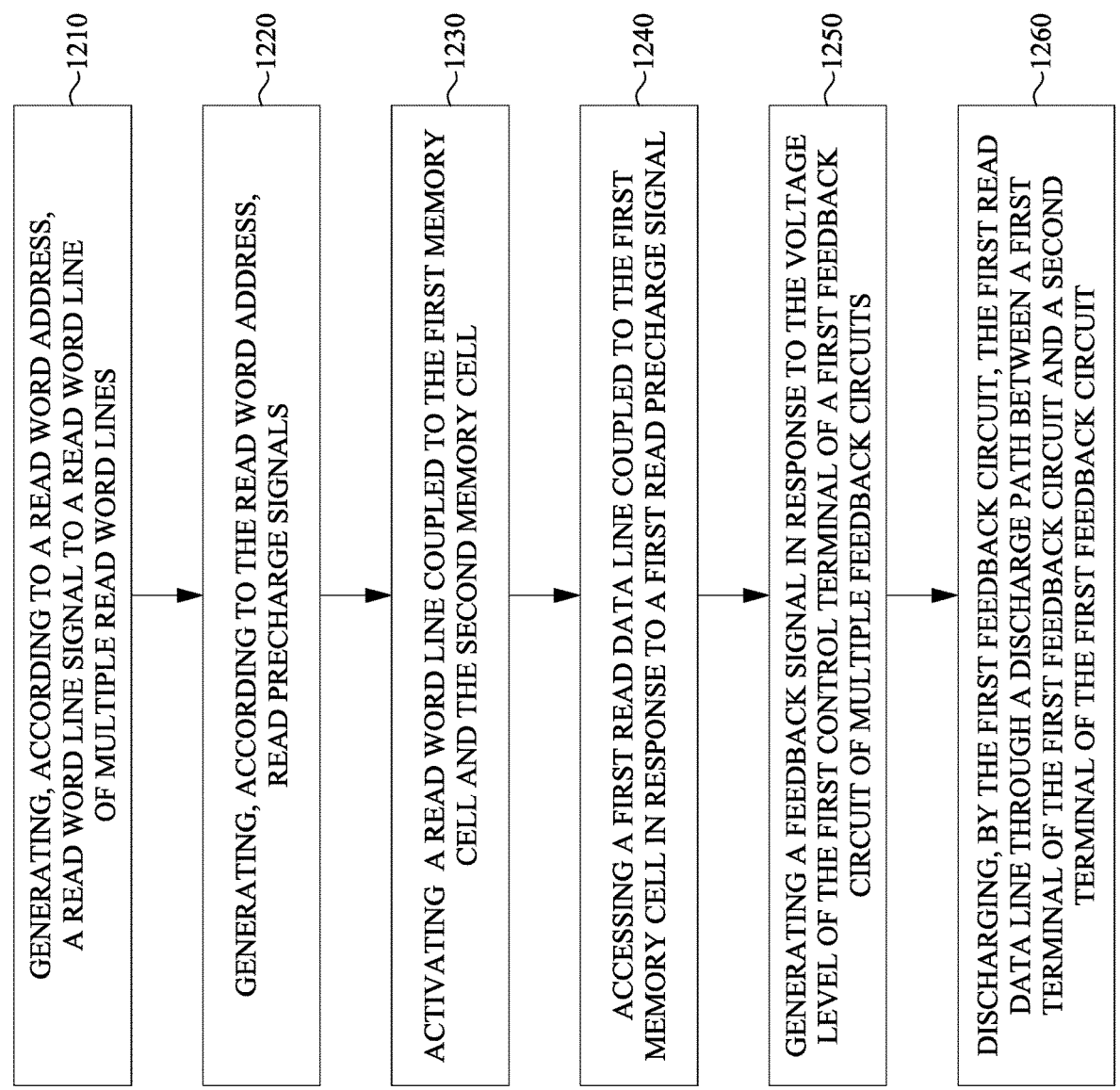
FIG. 12 is a flowchart of a method for operating a memory device to perform a read operation, in accordance with some embodiments of the present disclosure.
Figure 13:
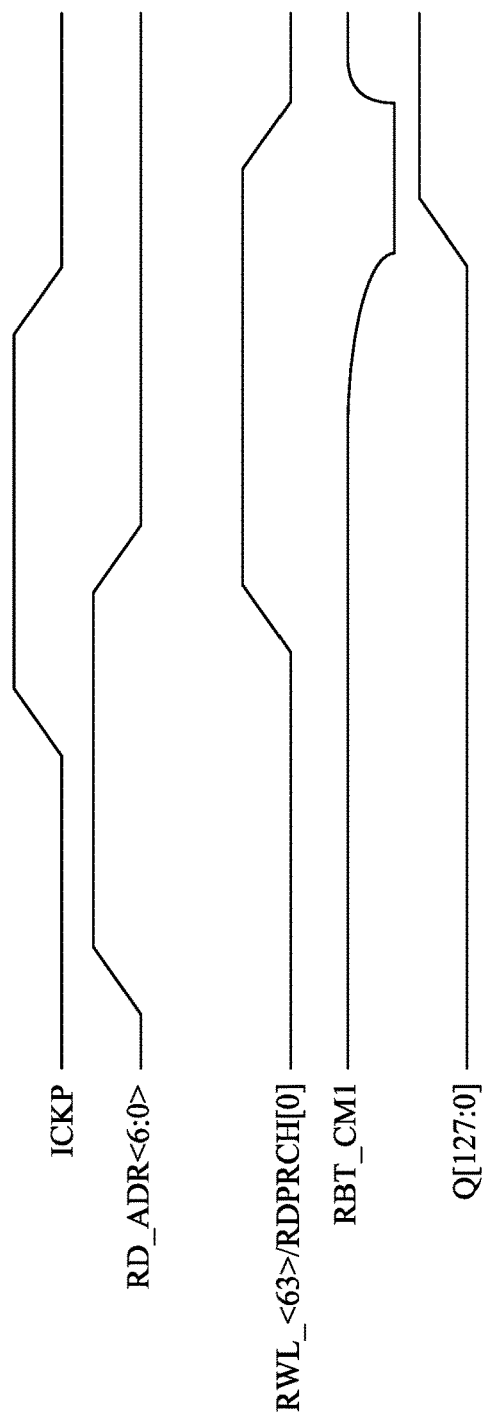
FIG. 13 illustrates waveforms of signals in the memory device operating corresponding to the method in FIG. 12, in accordance with some embodiments of the present disclosure.

Reference is now made to FIGS. 12-13. FIG. 12 is a flow chart of the method 1000 operating a memory device to perform a read operation, in accordance with some embodiments of the present disclosure. FIG. 13 illustrates waveforms of signals in the memory device operating corresponding to the method in FIG. 10, in accordance with some embodiments of the present disclosure. It is understood that additional operations can be provided before, during, and after the processes shown by FIG. 12, and some of the operations described below can be replaced or eliminated, for additional embodiments of the method. The order of the operations/processes may be interchangeable. Throughout the various views and illustrative embodiments, like reference numbers are used to designate like elements. The method 1200 includes operations 1210-1260 that are described below with reference to the memory device 10 and the waveforms in FIG. 13.

In operation 1210, the read signal RWL_<63> is generated according to the read word address RD_ADR<6:0> and based on the read clock signal ICKP to the read word line RWL_<63>. In some embodiments, as shown in FIG. 13, the read word address RD_ADR<6:0> is inputted and the read signal RWL_<63> is generated to have a high state when the read clock signal ICKP1 goes high.

In operation 1220, the read precharge signal RDPRCH [0]-RDPRCH[1] are generated based on the data RD_ADR<0> and the read clock signal RD_CLK. In some embodiments, for the read operation, the write precharge signals WRPRCH[0]-WRPRCH[1] and WRPRCHB[0]-WRPRCHB[1] have a logic "0".

In operation 1230, the read word line RWL_<63>, which is coupled the memory cells MC_1,63 and MC_2,63 in the 64th row and the first and second columns of the memory array 10.

In operation 1240, the read bit line RBT_CM1 coupled to the MC_1,63 is accessed in response to the RDPRCH[0] goes high, as shown in FIG. 13.

In operation 1250, the feedback signal FS is generated in response to the voltage level of a control terminal (i.e., the control terminal of the transistor MP1) of the feedback circuit PFC1 of the feedback circuits PFC1-PFC2.

In some embodiments, the method 1200 further includes turning on, in response to the feedback signal FS, the transistor MN1 to couple the read bit line RBT_CM1 to the ground for discharging the read bit line RBT_CM1.

In some embodiments, the generating the feedback signal FS further includes turning on the transistor MP1 in response to a voltage level of the read bit line RBT_CM1 decreasing to a first voltage level, and also includes outputting the feedback signal FS at a terminal of the transistor MP1 based on the supply voltage VDD received another terminal of the transistor MP1.

In operation 1260, the read bit line RBT_CM1 is discharged by the feedback circuit PFC1 through a discharge path between the first terminal, coupled to the read bit line RBT_CM1, of the feedback circuit PFC1 and the second terminal, coupled to the ground, of the feedback circuit PFC1.

In some embodiments, the method 1200 further includes turning of the feedback circuit PFC2 coupled to the read bit line RBT_CM2 when the feedback circuit PFC1 is discharging the read bit line RBT_CM1.

In some embodiments, based on experimental results, a duration between the inputting the write clock signal to the write control circuit 210 and the activating one memory cell in the memory array 10 changes from about 152 picoseconds to about 128 picoseconds, about 16% increase in speed. Furthermore, in another embodiment of a read operation, by utilizing the feedback circuit PFC, a duration between the activating one read word line and the outputting stored data drops from about 205 picoseconds to about 154 picoseconds, about 25% increase in speed. Accordingly, in yet another embodiment of a combination of read and write operations, a total duration between inputting the write clock signal to the outputting stored data decreases from about 357 picoseconds to about 274 picoseconds, about 24% increase in speed.

Furthermore, the configurations of separated word lines eliminate write noise induction during the write operation and improve the write SNM by a minimum of about 50 mV (i.e.) which equals to about 16% improvement in power dissipation.

As described above, the memory device in the present disclosure provides more than one write word lines for memory cells arranged in the same row to alleviate the read/write-disturb for improving the SNM. Moreover, the feedback circuit as an additional discharge path is provided to discharge the read bit line faster for optimizing read operation speed.

In some embodiments, a memory device is disclosed. The memory device includes a memory array including a first memory cell arranged in a first row and a first column and a second memory cell arranged in the first row and a second column next to the first column. The first memory cell is configured to perform a write operation in response to a first write signal transmitted through a first write word line. The second memory cell is configured to perform the write operation in response to a second write signal transmitted through a second write word line. The second write word line is separated from and next to the first write word line. The first write signal and the second write signal have different logic values.

Also disclosed is a memory device that includes a read port circuit of a memory cell, a read control gate coupled to the read port circuit by a read data line, and a feedback circuit. The read control gate is configured to precharge the read data line in response to a first precharge signal. The feedback circuit is coupled to the read data line and includes a sensing unit and a pull-down circuit. The sensing unit is configured to generate a feedback signal in response to a voltage level of the read data line. The pull-down circuit is configured to discharge the read data line in response to the feedback signal and a second precharge signal.

Also disclosed is a method that includes the operations below: activating, in a write operation, a first word line of multiple write word lines to access a data in a first memory cell in a first row and a first column of a memory array, and deactivating a second word line of the write word lines to electrically disconnect a second memory cell in the first row and a second column of the memory array from the second word line of the plurality of write word lines; activating, in a read operation, a read word line coupled to the first memory cell and the second memory cell; accessing a first read data line coupled to the first memory cell in response to a first precharge signal; and discharging, by a first feedback circuit of a plurality of feedback circuits, the first read data line through a discharge path between a first terminal of the first feedback circuit and a second terminal of the first feedback circuit in response to a voltage level of a first control terminal of the first feedback circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array comprising:
      a first memory cell that is arranged in a first row and a first column and coupled to a plurality of first write bit lines, and configured to operate in a write operation in response to a first write signal transmitted through a first write word line,
      wherein the first memory cell comprises a read port circuit coupled to a read data line and a first voltage terminal;
      a feedback circuit coupled between the read data line and a ground, and configured to discharge the read data line in response to a voltage level of the read data line; and
      a second memory cell that is arranged in the first row and a second column next to the first column and coupled to a plurality of second write bit lines different from the plurality of first write bit lines, and configured to operate in the write operation in response to a second write signal transmitted through a second write word line,
      wherein the second write word line is separated from and next to the first write word line;
      wherein the first write signal and the second write signal have different logic values.

2. The memory device of claim 1, wherein the first memory cell comprises a first write port circuit comprising a first pair of write pass gates coupled to the first write word line, and
   the second memory cell comprises a second write port circuit comprising a second pair of pass gates coupled to the second write word line.

3. The memory device of claim 1, wherein in a read operation of a low logic state of the first memory cell the feedback circuit is further configured to discharge the read data line.

4. The memory device of claim 1, wherein the feedback circuit comprises:
   a first transistor having a first terminal coupled to a second voltage terminal and a control terminal coupled to the read data line;
   a second transistor having a first terminal coupled to the ground, a second terminal coupled to a third terminal of the first transistor, and a control terminal coupled to a precharge signal; and
   a third transistor having a first terminal coupled to the read data line, a second terminal coupled to the ground, and a control terminal coupled to the third terminal of the first transistor and the second terminal of the second transistor.

5. The memory device of claim 4, wherein a first voltage outputted by the first voltage terminal is smaller than a second voltage outputted by the second voltage terminal.

6. The memory device of claim 1, further comprising:
   a write clock generator configured to output, in response column select signals based on a write word address, a first write clock signal and a second write clock signal to select one of the first memory cell and the second memory cell,
   wherein the first write clock signal and the second write clock signal have different logic values.

7. The memory device of claim 6, further comprising:
   a first decoder configured to generate the first write signal in response to the first write clock signal; and
   a second decoder configured to generate the second write signal in response to the second write clock signal.

8. The memory device of claim 1, wherein the first memory cell and the second memory cell are included respectively in a first array of memory cells in the first column and a second array of memory cells in the second column;
   wherein the memory device further comprises:
      a control unit configured to generate, based on a write word address, a first write clock signal, a second write clock signal, and a select signal to select a memory cell in the memory array;
      wherein when the first write clock signal has a high logic value and the second write clock signal has a low logic state, one cell in the first array of memory cells is selected for the write operation.

9. A memory device, comprising:
   a memory array comprising:
      a first memory cell arranged in a first row and a first column, wherein the first memory cell is coupled to a plurality of first write bit lines and a first write word line;
      a second memory cell arranged in the first row and a second column different from the first column, wherein the first memory cell is coupled to a plurality of second write bit lines different from the plurality of first write bit lines and a second write word line different from the first write word line,
      wherein the first and second write word lines are separated from each other, and configured to transmit, respectively, a first write signal having a first logic value to the first memory cell and a second write signal having a second logic value, different from the first logic value, to the second memory cell; and a control unit configured to output, based on a write word address, a first write clock signal for generating the first write signal, a second write clock signal for generating the second write signal, and a select signal to select the first memory cell or the second memory cell.

10. The memory device of claim 9, wherein the first write clock signal and the second write clock signal have different logic values.

11. The memory device of claim 9, wherein the control unit comprises:
a write clock generator configured to generate, based on the write word address and a write clock signal, the first write clock signal and the second write clock signal.

12. The memory device of claim 11, wherein the control unit further comprises:
a read control circuit configured to activate the first and second memory cells based on a read signal on a read word line coupled to the first and second memory cells.

13. The memory device of claim 9, further comprising:
a first feedback circuit coupled to the first memory cell by a first read data line, and configured to discharge the first read data line in a read operation of a low logic state of the first memory cell; and
a second feedback circuit coupled to the second memory cell by a second read data line, and configured to discharge the second read data line in a read operation of a low logic state of the second memory cell.

14. The memory device of claim 9, further comprising:
a feedback circuit coupled to the first memory cell through a read data line, comprising:
a first transistor configured to generate a feedback signal in response to a first voltage level of the read data line coupled to a control terminal of the first transistor; and
a second transistor configured to discharge the read data line, in response to the feedback signal, to have a second voltage level.

15. The memory device of claim 14, wherein the first transistor has a first terminal coupled to a first voltage terminal, and a second terminal coupled to a control terminal of the second transistor,
wherein the second transistor has a first terminal coupled to the read data line and a second terminal coupled to a second voltage terminal different from the first voltage terminal.

16. The memory device of claim 9, further comprising:
a first decoder configured to generate the first write signal in response to the first write clock signal; and
a second decoder configured to generate the second write signal in response to the second write clock signal.

17. A memory device, comprising:
a first memory cell and a second memory cell that are arranged in a first row, wherein the first memory cell is included in a first array of memory cells in a first column and coupled to a plurality of first write bit lines, and is configured to operate in a write operation in response to a first write signal transmitted through a first write word line,
wherein the second memory cell is included in a second array of memory cells in a second column, next to the first column, and coupled to a plurality of second write bit lines different from the plurality of first write bit lines, and is configured to operate in the write operation in response to a second write signal transmitted through a second write word line, wherein the second write word line is next to the first write word line; and
a write clock generator configured to output, in response column select signals based on a write word address, a first write clock signal for generating the first write signal and a second write clock signal for generating the second write signal,
wherein when the first write clock signal has a high logic value and the second write clock signal has a low logic state, the first memory cell is accessed.

18. The memory device of claim 17, wherein the first memory cell comprises:
a read port circuit coupled to a read data line and a first voltage terminal;
wherein the memory device further comprises:
a feedback circuit coupled between the read data line and a ground, configured to discharge the read data line in response to a voltage level of the read data line, and comprising:
a first transistor having a first terminal coupled to a second voltage terminal and a control terminal coupled to the read data line;
a second transistor having a first terminal coupled to a ground, a second terminal coupled to a third terminal of the first transistor, and a control terminal coupled to a precharge signal; and
a third transistor having a first terminal coupled to the read data line, a second terminal coupled to a ground, and a control terminal coupled to the third terminal of the first transistor and the second terminal of the second transistor.

19. The memory device of claim 17, further comprising:
a feedback circuit coupled to the first memory cell through a read data line, comprising:
a first transistor configured to generate a feedback signal in response to a first voltage level of the read data line coupled to a control terminal of the first transistor; and
a second transistor configured to discharge the read data line, in response to the feedback signal, to have a second voltage level,
wherein the first transistor is P-type, and the second transistor is N-type.

20. The memory device of claim 17, further comprising:
a read control circuit configured to activate the first and second memory cells based on a read signal on a read word line coupled to the first and second memory cells.

* * * * *